(12) United States Patent
Thon et al.

(10) Patent No.: US 12,348,181 B2
(45) Date of Patent: Jul. 1, 2025

(54) NON-IMAGING OPTICAL CONCENTRATOR

(71) Applicant: THE JOHNS HOPKINS UNIVERSITY, Baltimore, MD (US)

(72) Inventors: Susanna M. Thon, Baltimore, MD (US); Yida Lin, Baltimore, MD (US); Botong Qiu, Baltimore, MD (US); Garrett Ung, Manhattan Beach, CA (US); Lulin Li, Timonium-Lutherville, MD (US)

(73) Assignee: THE JOHNS HOPKINS UNIVERSITY, Baltimore, MD (US)

( * ) Notice: Subject to any disclaimer, the term of this patent is extended or adjusted under 35 U.S.C. 154(b) by 160 days.

(21) Appl. No.: 17/905,897

(22) PCT Filed: Mar. 11, 2021

(86) PCT No.: PCT/US2021/021984
§ 371 (c)(1),
(2) Date: Sep. 8, 2022

(87) PCT Pub. No.: WO2021/183815
PCT Pub. Date: Sep. 16, 2021

(65) Prior Publication Data
US 2023/0119967 A1    Apr. 20, 2023

Related U.S. Application Data

(60) Provisional application No. 62/988,249, filed on Mar. 11, 2020.

(51) Int. Cl.
*H10F 77/42*    (2025.01)
*G02B 19/00*    (2006.01)
(Continued)

(52) U.S. Cl.
CPC .......... *H02S 40/22* (2014.12); *G02B 19/0028* (2013.01); *G02B 19/0042* (2013.01); *H10F 77/492* (2025.01); *G02B 3/08* (2013.01)

(58) Field of Classification Search
CPC ... H01L 31/054–0549; H02S 40/20–22; H10F 77/40; H10F 77/413; H10F 77/42; H10F 77/492; H10F 77/488
See application file for complete search history.

(56) References Cited

U.S. PATENT DOCUMENTS

| 4,045,246 A | 8/1977 | Mlavsky et al. |
| 2005/0092360 A1 | 5/2005 | Clark |

(Continued)

FOREIGN PATENT DOCUMENTS

| CA | 2656977 A1 * | 1/2008 | ......... H01L 31/0543 |
| CN | 101425547 A * | 5/2009 | ......... H01L 31/0543 |

(Continued)

OTHER PUBLICATIONS

English machine translation of Sasaoka (JP 2002-289896) published Oct. 4, 2002.*

(Continued)

*Primary Examiner* — Christina Chern
(74) *Attorney, Agent, or Firm* — MH2 Technology Law Group LLP

(57) ABSTRACT

A non-imaging optical concentrator, including a top portion, a body, and a bottom portion, wherein the top portion is configured to receive an incident light and transmit the received incident light to the body when the incident light is within an angle of acceptance for the non-imaging optical concentrator, and where the body is configured to reflect the incident light transmitted by the top portion to the bottom portion when the incident light is within the angle of acceptance for the non-imaging optical concentrator, and wherein the top portion is configured to split or diverge the incident light into two or more directions when the incident light is within the angle of acceptance for the non-imaging optical concentrator.

20 Claims, 17 Drawing Sheets

(51) Int. Cl.
*H02S 40/22* (2014.01)
*G02B 3/08* (2006.01)

(56) References Cited

U.S. PATENT DOCUMENTS

| | | |
|---|---|---|
| 2009/0159126 A1 | 6/2009 | Chan |
| 2010/0078062 A1 | 4/2010 | Wang et al. |
| 2016/0048008 A1* | 2/2016 | Wang ..................... G02B 5/10 |
| | | 359/837 |

FOREIGN PATENT DOCUMENTS

| | | | | |
|---|---|---|---|---|
| JP | 2002289896 A | * | 10/2002 | ........... H01L 31/042 |
| WO | WO 2007/064431 | * | 6/2007 | ............. G02B 27/14 |

OTHER PUBLICATIONS

English machine translation of Zhang et al. (CN 101425547) published May 6, 2009.*
Eskina, E. (Authorized officer), International Search Report and Written Opinion in corresponding International Application No. PCT/US2021/021984 mailed on Jun. 3, 2021, 7 pages.
Melnikov, D. (Authorized officer), International Preliminary Report on Patentability in corresponding International Application No. PCT/US2021/021984 mailed on Sep. 6, 2022, 5 pages.

* cited by examiner

NON-IMAGING OPTICAL CONCENTRATOR

CROSS-REFERENCE TO RELATED APPLICATIONS

The present application is the national stage entry of International Patent Application No. PCT/US2021/021984, filed on Mar. 11, 2021, and published as International Publication No. WO 2021/183815 A1 on Sep. 16, 2021, which claims the benefit of priority of U.S. Provisional Application No. 62/988,249, filed on Mar. 11, 2020, all of which are hereby incorporated by reference herein in their entireties.

TECHNICAL FIELD

The present disclosure generally relates to solar concentrators, and in particular, to non-imaging optical concentrators.

BACKGROUND

Solar concentrators are used with solar cells to enhance electrical power generation. Solar concentrators use mirrors or lenses to focus sunlight onto small, highly-efficient solar cells, such as multi-junction solar cells. However, solar concentrators often suffer from small acceptance angles, requiring the use of external tracking systems to maximize the amount of incoming sunlight that can be captured by the solar concentrator.

Accordingly, there is a need for solar concentrators with an improved angle of acceptance that decrease or eliminate the need for sunlight tracking or tilting systems.

BRIEF SUMMARY

This summary is intended merely to introduce a simplified summary of some aspects of one or more implementations of the present disclosure. This summary is not an extensive overview, nor is it intended to identify key or critical elements of the present teachings, nor to delineate the scope of the disclosure. Rather, its purpose is merely to present one or more concepts in simplified form as a prelude to the detailed description below.

The foregoing and/or other aspects and utilities embodied in the present disclosure may be achieved by providing a non-imaging optical concentrator, including a top portion, a body, and a bottom portion, wherein the top portion is configured to receive an incident light and transmit the received incident light to the body when the incident light is within an angle of acceptance for the non-imaging optical concentrator, and where the body is configured to reflect the incident light transmitted by the top portion to the bottom portion when the incident light is within the angle of acceptance for the non-imaging optical concentrator, and wherein the top portion is configured to split or diverge the incident light into two or more directions when the incident light is within the angle of acceptance for the non-imaging optical concentrator.

The non-imaging optical concentrator may have a half-acceptance angle from about 5° to about 50°.

The non-imaging optical concentrator may have a geometric concentration ratio from about 5 to about 30.

The non-imaging optical concentrator may have a half-acceptance angle from about 5° to about 500 and a geometric concentration ratio from about 5 to about 30.

The top portion may include a Fresnel-lens like (FLL) microstructure.

The FLL microstructure may be configured to split or diverge incident light received by the top portion into two or more directions.

The FLL microstructure may not focus light to a single point.

The FLL microstructure may be integrally formed to the body.

The FLL microstructure may be separately formed and attached to the body.

The body may include one or more sidewalls configured to reflect the incident light transmitted by the top portion when the incident light is within the acceptance angle for the concentrator.

Each of the one or more sidewalls may include two or more reflecting portions and one or more non-reflecting portions.

A non-reflecting portion may be disposed between the two or more reflecting portions.

The two or more reflecting portions may correspond to the two or more directions of the incident light transmitted by the top portion when the incident light is within the angle of acceptance for the non-imaging optical concentrator.

The one or more non-reflecting sidewall portions do not reflect the incident light transmitted by the top portion when the incident light is within the angle of acceptance for the non-imaging optical concentrator.

The top portion and the body each may include a suitable optically clear or transparent material.

The FLL microstructure may include one or more of polydimethylsiloxane (PDMS), epoxy, spin-on glass (SOG), and acrylic materials.

The top portion and the body each may have a refractive index of about 1 or more.

The non-imaging optical concentrator including the FLL microstructure may have a larger geometric concentration ratio than a non-imaging optical concentrator with the same angle of acceptance but lacking the FLL microstructure.

The non-imaging optical concentrator including the one or more non-reflecting portions may have a larger geometric concentration ratio than a non-imaging optical concentrator with the same angle of acceptance but lacking the non-reflecting portions.

The foregoing and/or other aspects and utilities embodied in the present disclosure may be achieved by providing a solar cell, including a substrate; a solar cell disposed over the substrate; and a non-imaging optical concentrator optically aligned with the solar cell, wherein the non-imaging optical concentrator is configured to concentrate an incident light received by the non-imaging optical concentrator on the surface of the solar cell, and wherein the non-imaging optical concentrator, includes a non-imaging optical concentrator, wherein the non-imaging optical concentrator includes a top portion, a body, and a bottom portion, wherein the top portion is configured to receive an incident light and transmit the received incident light to the body when the incident light is within an angle of acceptance for the non-imaging optical concentrator, and where the body is configured to reflect the incident light transmitted by the top portion to the bottom portion when the incident light is within the angle of acceptance for the non-imaging optical concentrator, and wherein the top portion is configured to split or diverge the incident light into two or more directions when the incident light is within the angle of acceptance for the non-imaging optical concentrator.

Further areas of applicability will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The accompanying drawings, which are incorporated in, and constitute a part of this specification, illustrate implementations of the present teachings and, together with the description, serve to explain the principles of the disclosure. In the figures.

Figure 1:
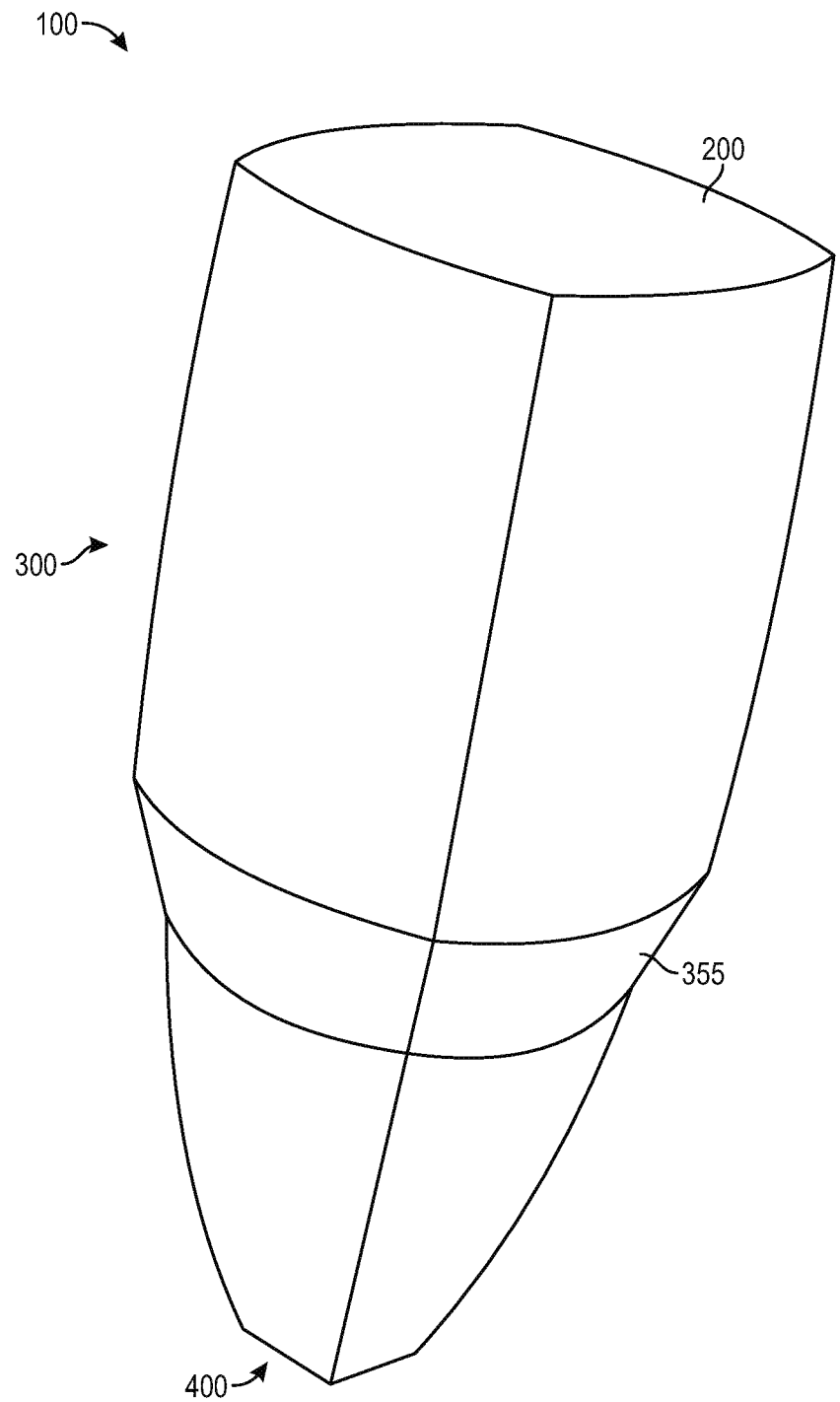
FIG. 1 illustrates a non-imaging optical concentrator according to an implementation of the present disclosure.

It should be noted that some details of the figures have been simplified and are drawn to facilitate understanding of the present teachings rather than to maintain strict structural accuracy, detail, and scale.

DETAILED DESCRIPTION

Reference will now be made in detail to exemplary implementations of the present teachings, examples of which are illustrated in the accompanying drawings. Generally, the same reference numbers will be used throughout the drawings to refer to the same or like parts.

Throughout the specification and claims, the following terms take the meanings explicitly associated herein, unless the context clearly dictates otherwise. Phrases, such as, "in an implementation," "in certain implementations," and "in some implementations" as used herein do not necessarily refer to the same implementation(s), though they may. Furthermore, the phrases "in another implementation" and "in some other implementations" as used herein do not necessarily refer to a different implementation, although they may. As described below, various implementations can be readily combined, without departing from the scope or spirit of the present disclosure.

As used herein, the term "or" is an inclusive operator, and is equivalent to the term "and/or," unless the context clearly dictates otherwise. The term "based on" is not exclusive and allows for being based on additional factors not described, unless the context clearly dictates otherwise. In the specification, the recitation of "at least one of A, B, and C," includes implementations containing A, B, or C, multiple examples of A, B, or C, or combinations of A/B, A/C, B/C, A/B/B/B/B/C, A/B/C, etc. In addition, throughout the specification, the meaning of "a," "an," and "the" include plural references. The meaning of "in" includes "in" and "on."

It will also be understood that, although the terms first, second, etc. can be used herein to describe various elements, these elements should not be limited by these terms. These terms are only used to distinguish one element from another. For example, a first object, component, or step could be termed a second object, component, or step, and, similarly, a second object, component, or step could be termed a first object, component, or step, without departing from the scope of the invention. The first object, component, or step, and the second object, component, or step, are both, objects, component, or steps, respectively, but they are not to be considered the same object, component, or step. It will be further understood that the terms "includes," "including," "comprises" and/or "comprising," when used in this specification, specify the presence of stated features, steps, operations, elements, and/or components, but do not preclude the presence or addition of one or more other features, steps, operations, elements, components, and/or groups thereof. Further, as used herein, the term "if" can be construed to mean "when" or "upon" or "in response to determining" or "in response to detecting," depending on the context.

All physical properties that are defined hereinafter are measured at 200 to 250 Celsius unless otherwise specified.

When referring to any numerical range of values herein, such ranges are understood to include each and every number and/or fraction between the stated range minimum and maximum, as well as the endpoints. For example, a range of 0.5% to 6% would expressly include all intermediate values of, for example, 0.6%, 0.7%, and 0.9%, all the way up to and including 5.95%, 5.97%, and 5.99%, among many others. The same applies to each other numerical property and/or elemental range set forth herein, unless the context clearly dictates otherwise.

Additionally, all numerical values are "about" or "approximately" the indicated value, and take into account experimental error and variations that would be expected by a person having ordinary skill in the art. It should be appreciated that all numerical values and ranges disclosed herein are approximate values and ranges. The terms "about" or "substantial" and "substantially" or "approximately," with reference to amounts or measurement values, are meant that the recited characteristic, parameter, or values need not be achieved exactly. Rather, deviations or variations, including, for example, tolerances, measurement error, measurement accuracy limitations, and other factors known to those skilled in the art, may occur in amounts that do not preclude the effect that the characteristic was intended to provide.

Unless otherwise specified, all percentages and amounts expressed herein and elsewhere in the specification should be understood to refer to percentages by weight of total solids. The percentages and amounts given are based on the active weight of the material. For example, for an active ingredient provided as a solution, the amounts given are based on the amount of the active ingredient without the amount of solvent or may be determined by weight loss after evaporation of the solvent.

With regard to procedures, methods, techniques, and workflows that are in accordance with some implementations, some operations in the procedures, methods, techniques, and workflows disclosed herein can be combined and/or the order of some operations can be changed.

The inventors have developed a new non-imaging optical concentrator with an expanded acceptance angle and concentration ratio that eliminates the need for sunlight tracking or tilting system.

FIG. 1 illustrates a non-imaging optical concentrator according to an implementation of the present disclosure. As illustrated in FIG. 1, a non-imaging optical concentrator 100 (or concentrator 100) may include a top portion 200, a body 300, and a bottom portion 400.

The top portion 200 may be configured to receive an incident light and transmit it to the body 300 when the incident light is within the angle of acceptance for the concentrator 100. The top portion 200 may be configured to shape a wavefront into a diverging or converging light wave. For example, the top portion 200 may be configured to split or diverge the incident light into two or more directions when the incident light is within the angle of acceptance for the concentrator 100.

The top portion 200 may include a Fresnel-lens-like microstructure 250. The concentrator 100 may be implemented as a modified dielectric total internal reflection concentrator (DTIRC) including a Fresnel-like microstructure 250 in the top portion 200.

Figure 2:
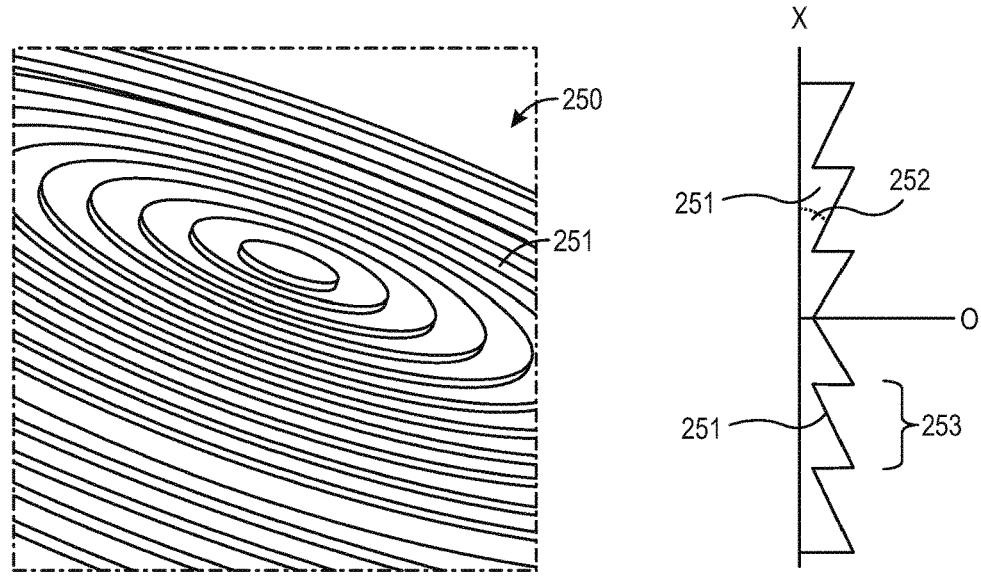
FIG. 2 illustrates a Fresnel-lens like microstructure according to an implementation.

FIG. 2 illustrates a Fresnel-lens like microstructure according to an implementation. As used herein, the term "Fresnel-lens-like" microstructure or FLL microstructure refers to a microstructure of optical clear or transparent material arranged in concentric rings. As illustrated in FIG. 2, a Fresnel-lens like microstructure 250 includes one or more concentric rings 251. Unlike traditional Fresnel lenses, the FLL microstructure does not focus light to a single point. Instead, the FLL microstructure 250 is configured to split or diverge incident light into two or more directions. Accordingly, the FLL microstructure 250 may be configured to split or diverge incident light received by the top portion 200 into two or more directions.

In one implementation, the wedge angle for the one or more concentric rings 251 determines the split or divergence of the incident light into two or more directions. That is, the wedge angles may determine both the number and direction of the diverged incident light. As illustrated in FIG. 2, a wedge angle 252 refers to an angle with respect to an x-y plane orthogonal to an optical axis O. For example, the one or more concentric rings 251 may have a wedge angle 252 from about 8° to about 15°. In one implementation, the one or more concentric rings 251 have a wedge angle 252 of about 10°. As illustrated in FIG. 2, a width 253 of the one or more concentric rings 251 may be from about 5 μm to about 20 μm.

While the present disclosure is described with respect to a FLL microstructure 250, the disclosure is not limited thereto, and the top portion 200 may include other type of structures or geometries configured to split or diverge incident light into two or more directions. For example, the top portion 200 may include a flat (planar) surface, a spherical convex or concave surface, and elliptical convex or concave surface, a parabolic convex or concave surface, a linear ramped surface, and an asymmetric top surface combining two or more of the surfaces described above.

The top portion 200 and/or the FLL microstructure 250 may be fabricated using any suitable optically clear or transparent material. For example, the FLL microstructure 250 may include rigid materials, such as a rigid glass material, or flexible materials, such as flexible polymeric or glass materials. The FLL microstructure 250 may include one or more of polydimethylsiloxane (PDMS), epoxy, spin-on glass (SOG), and acrylic materials. The top portion 200 and/or the FLL microstructure 250 may also include any transparent dielectric material, such as various metal oxides, and any transparent plastic material.

The FLL microstructure 250 may have a refractive index of about 1 or more. For example, the FLL microstructure 250 may have a refractive index of about 1.5 or more, 2 or more, and 2.5 or more. In other implementations, the FLL microstructure 250 has a refractive index of about 1.1 or more, 1.2 or more, 1.3 or more, 1.4 or more, 1.5 or more, 1.6 or more, and 1.7 or more.

The FLL microstructure 250 may be unitary with the concentrator 100. For example, the FLL microstructure 250 may be integrally formed with the top portion 200, the body 300, and the bottom portion 400 forming the concentrator 100. In other implementations, the FLL microstructure 250 may be separately formed from the body 300 and the bottom portion 400.

The FLL microstructure 250 may be configured for additive manufacturing or 3-D printing. For example, the FLL microstructure 250 may include a pourable or moldable material configured for light-based or thermal-based curing.

Figure 3:
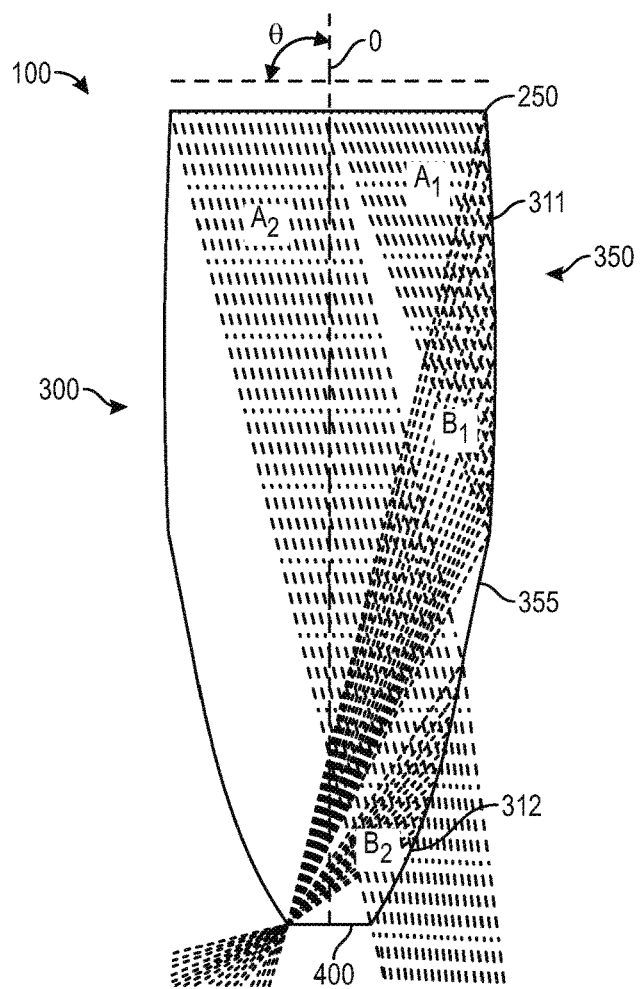
FIG. 3 illustrates a cross section of a non-imaging optical concentrator according to an implementation.

FIG. 3 illustrates a cross section of a non-imaging optical concentrator according to an implementation. As illustrated in FIG. 3, the body 300 may include one or more sidewalls 350 configured to reflect an incident light A (A1-A2) transmitted by the top portion 200 when the incident light is within the acceptance angle for the concentrator 100. The sidewalls 350 may reflect the incident light to the bottom portion 400 when the incident light is within the acceptance angle for the concentrator 100. The reflected incident light B (B1-B2) then exits the concentrator 100 through the bottom portion 400.

As illustrated in FIG. 3, each of the one or more sidewalls 350 includes one or more non-reflecting portions 355. The non-reflecting portions 355 are configured not to receive the incident light A (A1-A2) transmitted by the top portion 200 when the incident light is within the acceptance angle for the concentrator 100. That is, the one or more non-reflecting sidewall portions 355 do not reflect the incident light transmitted by the top portion 200 when the incident light is within the angle of acceptance for the concentrator 100. Similarly, the non-reflecting portions 355 do not reflect the incident light to the bottom portion 400 when the incident light is within the acceptance angle for the concentrator 100.

Each of the one or more sidewalls 350 includes two or more reflecting portions 310. For example, as illustrated in FIG. 3, a sidewall 350 may include two reflecting portions 310: an upper reflecting portion 311 and a lower reflecting portion 312.

A non-reflecting portion 355 may be disposed between the two or more reflecting portions 310. For example, as illustrated in FIG. 3, a nonreflecting portion 355 is disposed between the upper reflecting portion 311 and the lower reflecting portion 312.

The reflecting portions 310 may correspond to the incident light transmitted by the top portion 200 when the incident light is within the acceptance angle for the concentrator 100. For example, as illustrated in FIG. 3, the upper reflecting portion 311 may be configured to receive the incident light A1 transmitted by the top portion 200 when the incident light is within the acceptance angle for the concentrator 100. Similarly, the bottom reflecting portion 312 may be configured to receive the incident light A2 transmitted by the top portion 200 when the incident light is within the acceptance angle for the concentrator 100

While FIG. 3 is illustrated with respect to incident light received at a particular angle of acceptance, the present disclosure is not limited thereto. The reflecting portions 310 are configured to reflect incident light transmitted by the top portion 200 when the incident light is within the acceptance angle for the concentrator 100. The transmitted incident light may hit one or more of the reflecting portions 310. The non-reflecting portions 355 are configured not to reflect incident light transmitted by the top portion 200 when the incident light is within the acceptance angle for the concentrator 100. The transmitted incident light may not hit the one or more non-reflecting portions 355 when the incident light is within the acceptance angle for the concentrator 100.

The body 300 may be fabricated using any suitable optically clear or transparent material. For example, the body 300 may include rigid materials, such as a rigid glass material, or flexible materials, such as flexible polymeric or glass materials. The body 300 may include one or more of polydimethylsiloxane (PDMS), epoxy, spin-on glass (SOG), and acrylic materials. The body 300 may also include any transparent dielectric material, such as various metal oxides, and any transparent plastic material.

The body 300 may have a refractive index greater than 1. For example, the body 300 may have a refractive index of about 1.5 or more, 2 or more, and 2.5 or more. In other implementations, the body 300 has a refractive index of about 1.1 or more, 1.2 or more, 1.3 or more, 1.4 or more, 1.5 or more, 1.6 or more, and 1.7 or more.

The body 300 may be unitary with the concentrator 100 and/or the bottom portion 400. For example, the body 300 may be integrally formed with the top portion 200 and/or the body 300 may be integrally formed with the bottom portion 400.

The body 300 may be configured for additive manufacturing or 3-D printing. For example, the body 300 may include a pourable or moldable material configured for light-based or thermal-based curing.

The bottom portion 400 is configured to receive the incident light A (A1-A2) transmitted by the top portion 200 and reflected B (B1-B2) by the body 300 when the incident light is within the acceptance angle for the concentrator 100.

The bottom portion 400 may be placed over a solar cell (not illustrated), for example, a triple junction III-V solar cell, and the solar cell may be configured to receive the light received by the bottom portion 400 when the incident light is within the acceptance angle for the concentrator 100.

The bottom portion 400 may be fabricated using any suitable optically clear or transparent material. For example, the bottom portion 400 may include the same material as the body 300, and may have the same refractive index as the body 300.

The concentrator 100 may have rotational symmetry around an optical axis O. For example, the concentrator 100 may have two mirror symmetries along the x and y axis of a 4-fold symmetry.

As used herein, the term "geometric concentration ratio" refers to the ratio between an aperture area for the top portion 200 and the aperture area for the bottom portion 400. That is, a ratio of the area over which the concentrator 100 collects incident light to the area over which the concentrator 100 reflects the incident light. The concentrator 100 may have a geometrical concentration ratio from about 1 to about 50. For example, the concentrator 100 may have a geometrical concentration ratio from about 1 to about 40, from about 1 to about 30, from about 1 to about 20, or from about 1 to about 20. In some implementations the concentrator 100 has a geometrical concentration ratio from about 9 to about 13.

As used herein, the terms "angle of acceptance" or "acceptance angle" refers to the maximum angle or angle range at which incoming at least 50% of the incident light can be collected by the concentrator and directed to the focal plane (i.e. the aperture area for the bottom portion 400). The acceptance angle may be defined with respect to an optical angle of the concentrator. For example, as illustrated in FIG. 3, a half acceptance angle "θ" of the concentrator 100 may be defined with respect to the optical axis O. The concentrator 100 may then have a (total) acceptance angle of 2θ, since the concentrator 100 may accept light within an angle+/−θ to the optical axis O.

Accordingly, the concentrator 100 may have a half-acceptance angle from about 5° to about 50°. For example, the concentrator 100 may have a half-acceptance angle from about 100 to about 400 and from about 200 to about 30°.

In some implementations, the concentrator 100 has a geometric concentration ratio from about 1 to about 50 and a half-acceptance angle from about 5° to about 50°. For example, the concentrator 100 may have a geometric concentration ratio from about 9 to about 13 and a half-acceptance angle from about 20° to about 30°.

The concentrator 100 may be designed according to an iterative process as described below. The performance of the concentrator design may be verified using ray-tracing calculations.

For example, the top portion 200 may be defined in terms of an entrance plane formed by the FLL microstructure 250. The entrance plane formed by the FLL microstructure 250 may take the form of Equation (1) below:

$$\beta(x) = \text{sgn}(x)\beta_{max}\left(\text{abs}\left(\frac{x}{r_1}\right)\right)^\gamma \quad (1)$$

where $\beta_{max}$ is the angle of the Fresnel ramp at the edge of the plane, $r_1$ is the size of the plane, $$-r_1 < x < r_1 \quad \left(\text{or } r_1 = \frac{d_1}{2}\right)$$

and $\beta$ is the angle of the Fresnel ramp at position x.

Figure 4:
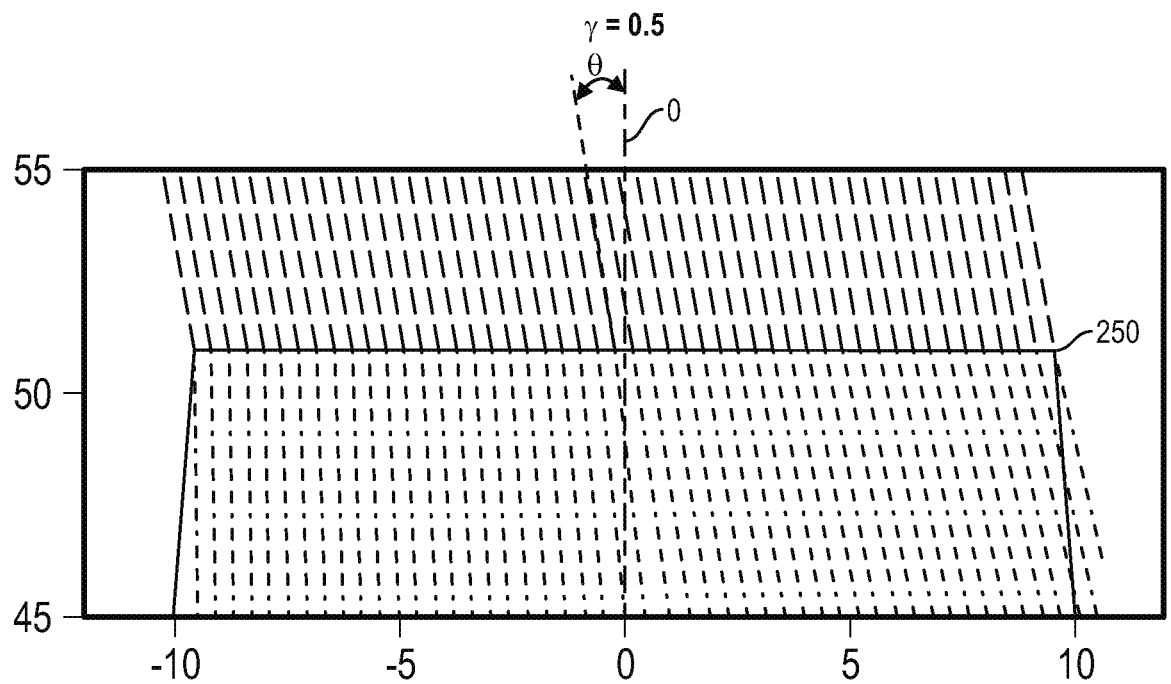
FIG. 4 illustrates a parallel ray diagram according to an implementation.
Figure 5:
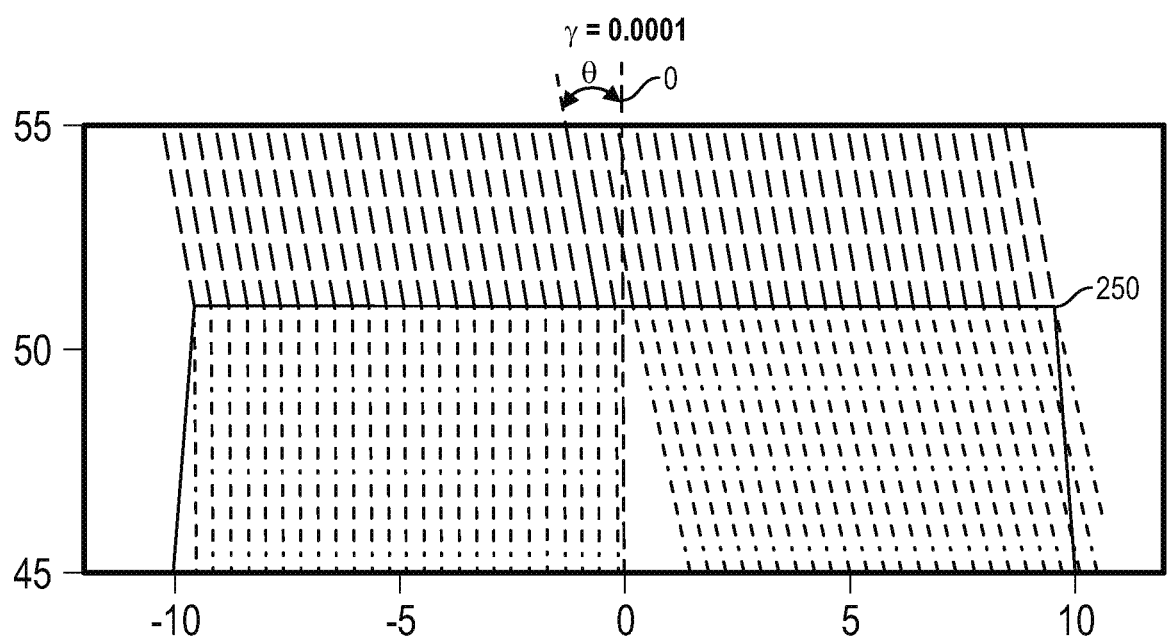
FIG. 5 illustrates a parallel ray diagram according to an implementation.

FIGS. 4 and 5 illustrate a parallel ray diagram according to an implementation. In particular, FIGS. 4-5 illustrate parallel rays passing through an entrance plane formed by the FLL microstructure 250 with a medium refractive index of n=1.4, an incident angle of 10°, and a $\beta_{max}=20°$. As illustrated in FIGS. 4-5, a positive $\beta_{max}$ creates an effectively concave (divergent) lens surface and vice versa. When $\gamma \approx 0$, the entrance plane formed by the FLL microstructure 250 effectively splits the incident rays into two directions.

The optical path lengths (OPLs) of all rays incident at the design half-acceptance angle $\theta_A$, hitting the bottom surface of the concentrator 100, can then be associated based on Fermat's principle that all rays should have identical OPL between two wave fronts.

Figure 6:
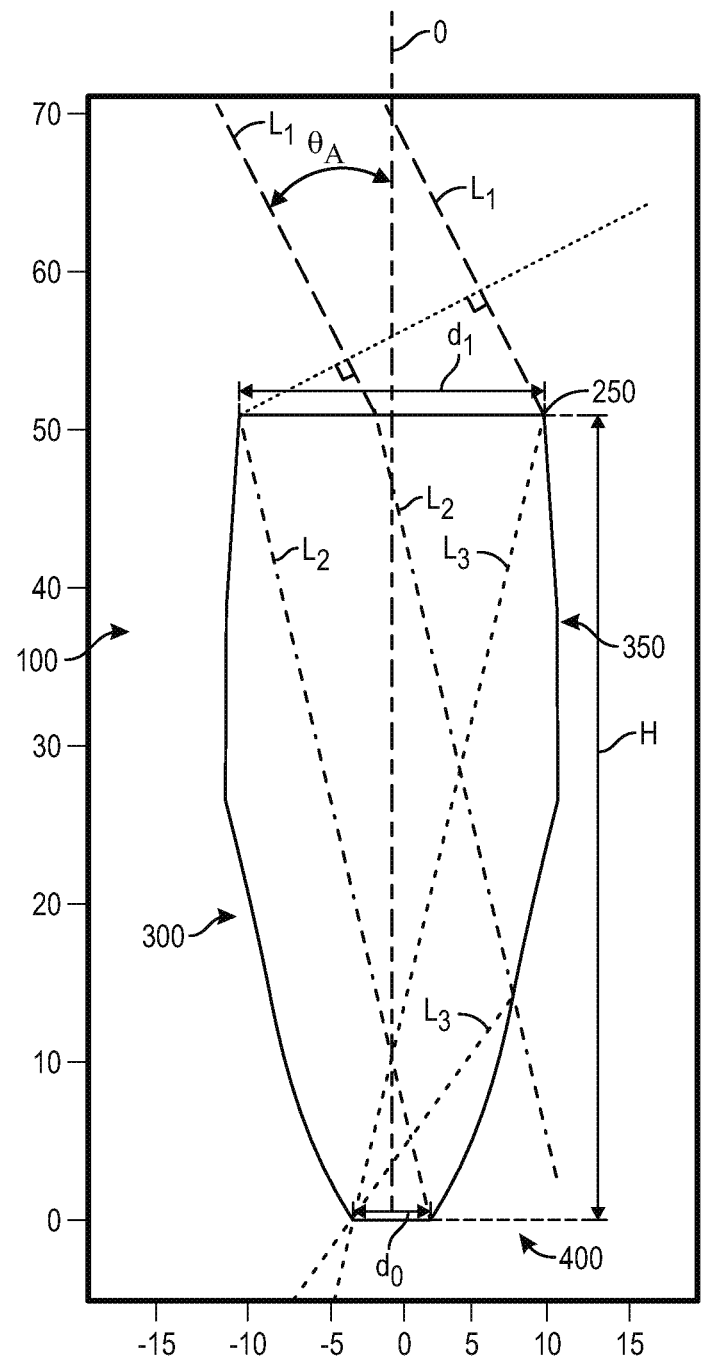
FIG. 6 illustrates an optical path analysis according to an implementation.

FIG. 6 illustrates an optical path analysis according to an implementation. As illustrated in FIG. 6, by setting the OPL of a given ray as equal to that of the ray hitting the edge of the entrance plane, if the lengths are $l_1$, $l_2$, and $l_3$ then the constant OPL C can be defined as Equation (2)

$$l_1 + n(l_2 + l_3) = C, \quad (2)$$

where n is the refractive index of the medium.

Meanwhile, we have that $$l_1 = \left(x_d - \frac{d_1}{2}\right) x \sin\theta_A,$$

where $x_d$ is the distance from the center of the entrance plane. Denoting the point where a given ray hits the sidewall 350 as (x, y), we can then define the following equations:

$$l_2 \cos\theta_p = H - y, \quad (3)$$

$$l_2 \sin\theta_p = x - x_d, \text{ and} \quad (4)$$

$$l_3^2 = \left(x + \frac{d_0}{2}\right)^2 + y^2 \text{ where } \theta_p + a\sin\left(\frac{\sin(\theta_A + \beta)}{n}\right) + \beta \quad (5)$$

is the refraction angle of this ray.

To obtain the constant OPL C, we need to know $l_3$ for the rightmost ray, which due to the symmetry of the concentrator 100, is just $l_2$ for the leftmost ray, from the top left corner to the bottom left corner. The direction of this ray is determined by the refraction of the ray incident at $\theta_A$ by the Fresnel ramp at the corresponding location, which is defined by Equation (6):

$$l^* = \frac{d_0 + d_1}{2} * \csc\Theta, \text{ where } \Theta = a\sin\left(\frac{\sin(\theta_{A+}\beta_{max})}{n}\right) - \beta_{max}, \quad (6)$$

and $d_0$ and $d_1$ correspond to the dimensions of the bottom and upper planes, respectively, as illustrated in FIG. 6.

Thus, the constant OPL C can be defined by Equitation (7) as:

$$C = d_1 \sin\theta_A + (d_0 + d_1)\frac{\csc\Theta}{2} \quad (7)$$

And the height H of the concentrator 100 can be defined as Equation 8.

$$H = \frac{(d_0 + d_1)\cot\Theta}{2} \quad (8)$$

Solving Equations (1-8) above would normally yield one more unknown variable than the number of equations. However, because the entrance plane is formed by the FLL microstructure 250, the (x, y) coordinates are only valid when $$x = \frac{d_1}{2} \text{ and } y = H \text{ if } x_d = \frac{d_1}{2}.$$

Accordingly, the variables in Equations (1-8) can be solved recursively by requiring the convergence of (x, y) to $$\left(\frac{d_1}{2}, H\right).$$

However, before the calculations for Equations (1-8) can be carried out, the OPLs need to be adjusted to accommodate the FLL microstructure 250. That is, because they have passed different locations from the FLL microstructure 250, there will be an OPL difference for two rays at the same wave front. Accordingly, there is an additional OPL segment for the entrance plane formed by the FLL microstructure 250 (Equation (1)) defined as Equation 9:

$$\Delta\text{OPL} = \int_{r_1}^{x_d} (n \sin\theta_p - \sin\theta_A)dx \quad (9)$$

with respect to the OPL of the rightmost ray, and now the OPL equation should be re-written as:

$$l_1 + n(l_2 + l_3) = C + \Delta\text{OPL} \quad (10)$$

Figure 7:
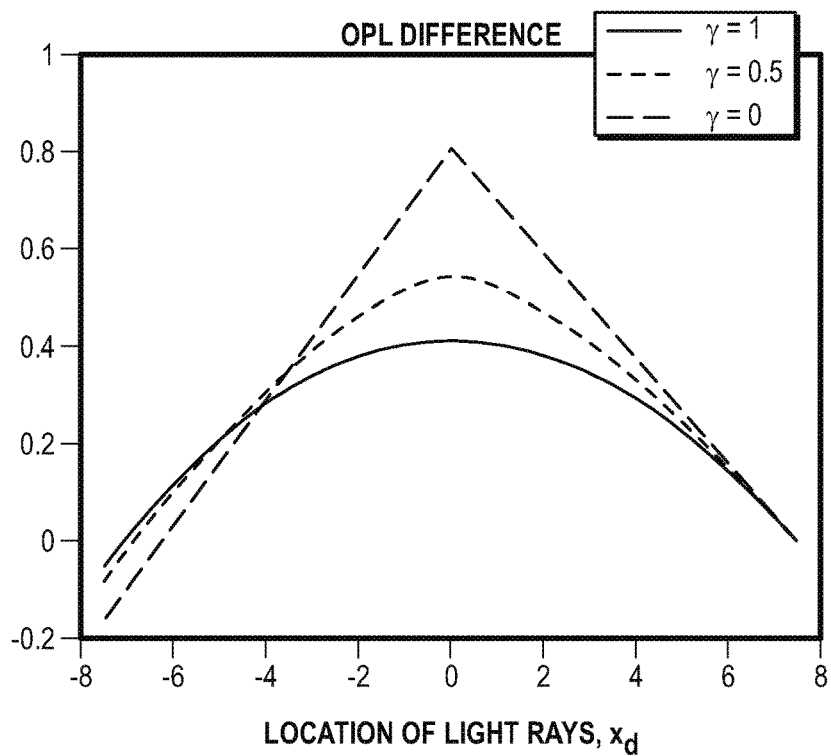
FIG. 7 illustrates an optical path diagram according to an implementation.
Figure 8:
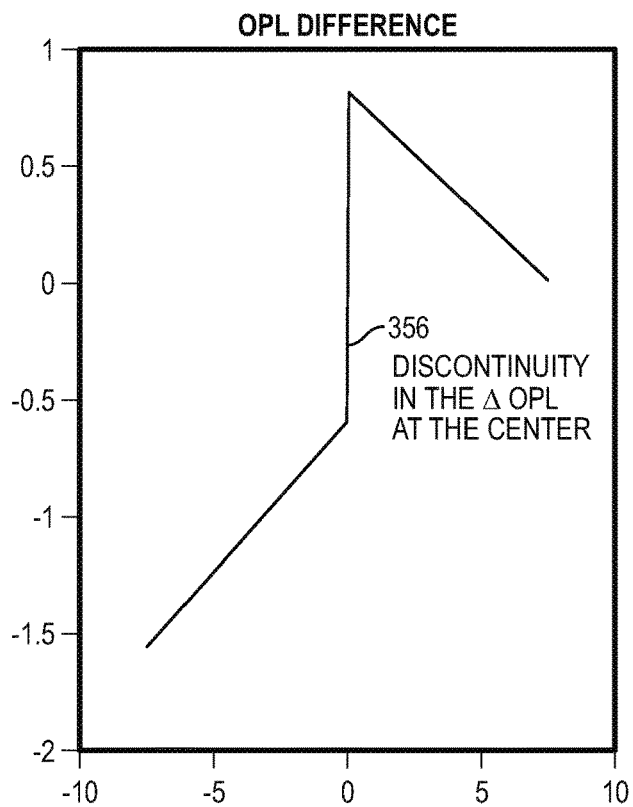
FIG. 8 illustrates a discontinuity according to an implementation.
Figure 9:
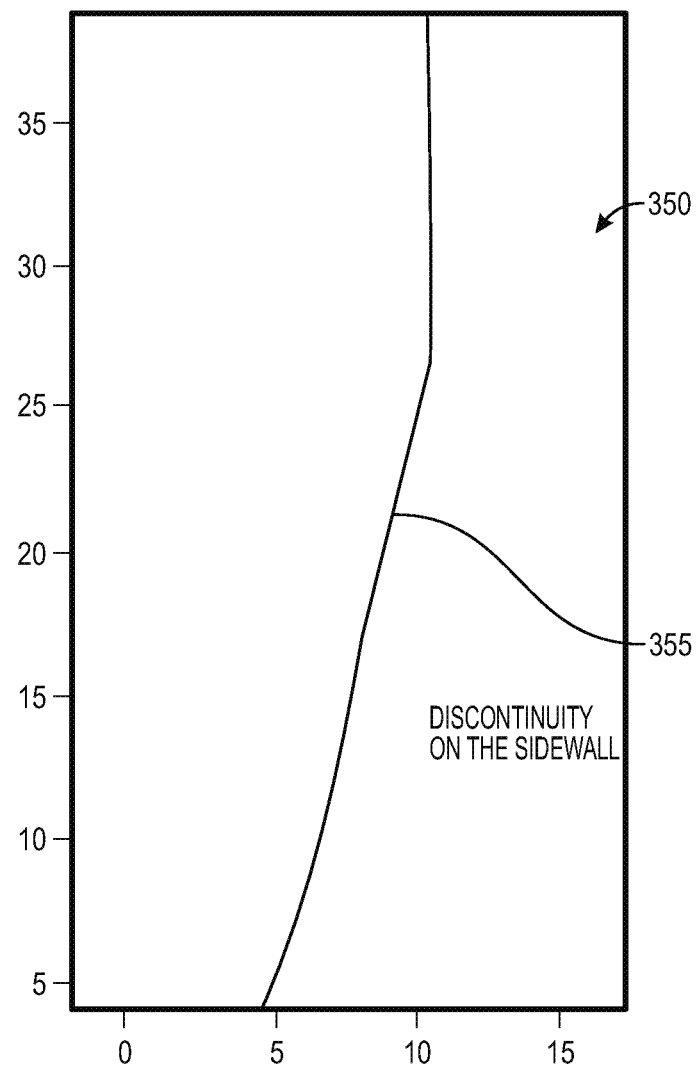
FIG. 9 illustrates a discontinuity according to an implementation.
Figure 10:
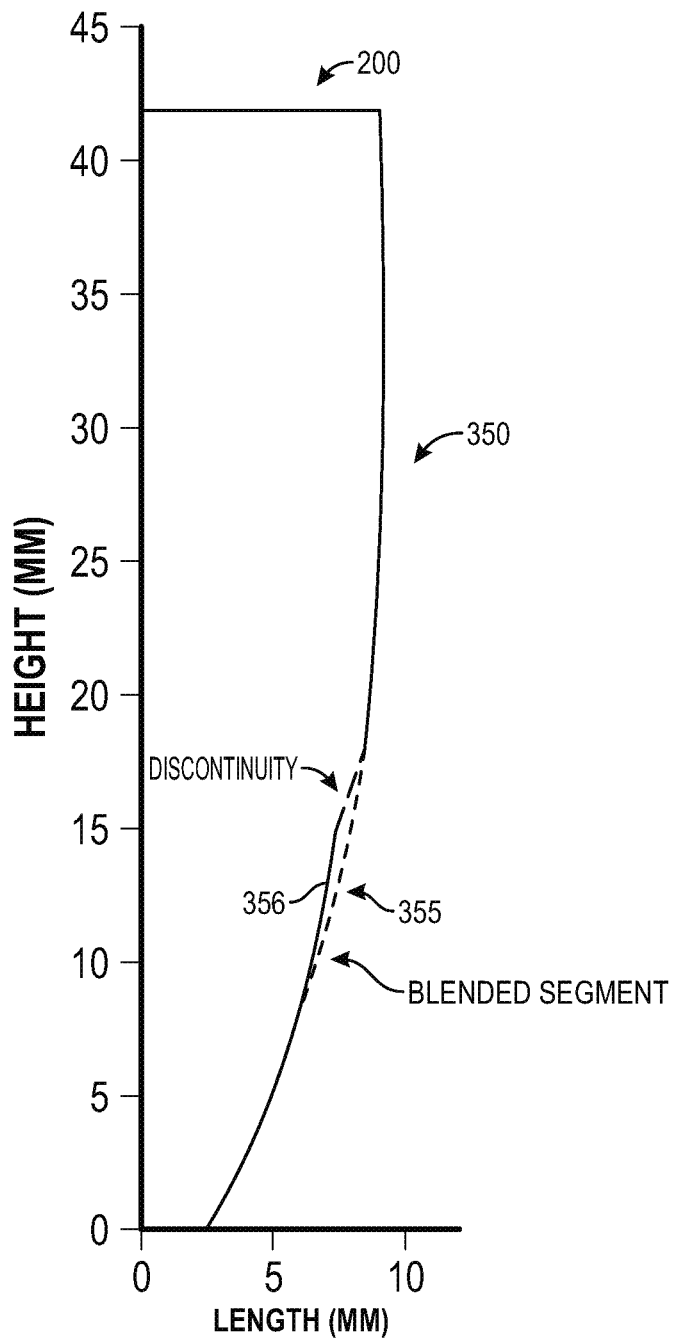
FIG. 10 illustrates a discontinuity according to an implementation.

FIG. 7 illustrates an optical path diagram according to an implementation. FIGS. 8-10 illustrate a discontinuity according to an implementation. In particular, a $\Delta$OPL is plotted as a function of the ray incident point x for different types of FLL microstructures 250. As illustrated in FIG. 7, for y=0, the OPL has a sharp turning point in the center of the entrance plane formed by the FLL microstructure 250, due to the sudden change of the slopes of the FLL microstructure ramps. This turning point will create a corresponding turning point on the sidewall 350. To enlarge the size of the entrance plane so that a higher concentration ratio can be achieved, a discontinuity 356 is added to the OPL at exactly the center point (FIG. 8). The corresponding discontinuity 356 is added to the side profile (FIG. 9) to define non-reflecting portions 355.

Adding the discontinuity 356 to the turning point of the OPL is advantageous since the turning point and discontinuity 356 lie at the same location on the side profile so the deflection of rays to undesired directions when incident from angles smaller than the acceptance angle is minimized.

In some implementations, the sidewall 355 will include a non-reflecting portion 355 defined by the discontinuity 356 that is undefined when optimizing the design for rays incident at the acceptance angle for the concentrator 100. AS illustrated in FIG. 10, the discontinuity 356 has to be interpolated and blended with the reflecting portions 310 to define the non-reflecting portions 355. Otherwise, some of the rays incident at small angles will be reflected in undesired directions, ultimately exiting the concentrator and lowering the concentration efficiency.

Figure 11:
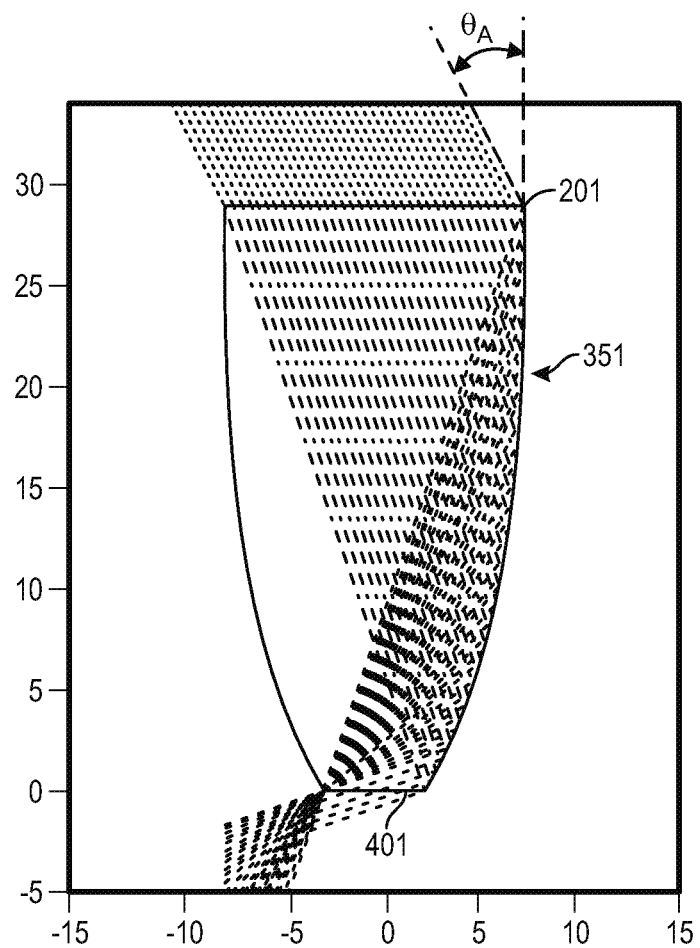
FIG. 11 illustrates a cross section of a conventional DTIR collector.

FIG. 11 illustrates a cross section of a conventional DTIR collector. As illustrated in FIG. 11, incident rays at a half-acceptance angle $\theta$A are transmitted by a top surface 201 to a sidewall 351 of a concentrator 101. The sidewall 351 reflects the transmitted rays through total-internal reflection to a bottom portion 401. Following the principle of equal-optical-path-length, the sidewall 351 reflects part of the rays to focus on a corner of the bottom portion 401, with the rest exiting parallel.

Figure 12:
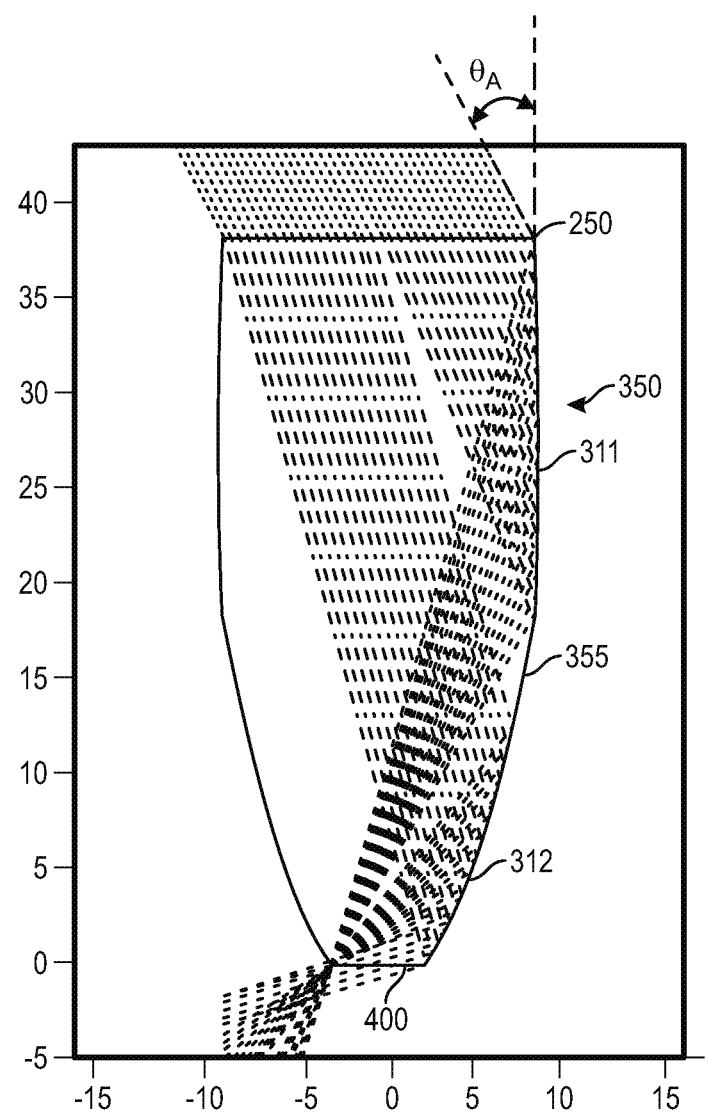
FIG. 12 illustrates a collector incorporating a FLL microstructure according to an implementation.

FIG. 12 illustrates a collector incorporating a FLL microstructure according to an implementation. As illustrated in FIG. 12, incident rays receive at the half-acceptance angle $\theta_A$ are split into 2 directions by the FLL microstructure 250 which are reflected to the bottom portion 400. The incident rays are transmitted to the reflecting portions 311 and 312 of the sidewall 350. Under a modified equal-optical-path-length principle compensating for the FLL microstructure 250, the sidewall includes a non-reflecting portion 355 (defined by a discontinuity 356) where incident rays do not arrive at the half-acceptance angle $\theta_A$. Accordingly, there can be an additional optical path length difference based on this discontinuity 356 (and the resulting non-reflecting portion 355).

Figure 13:
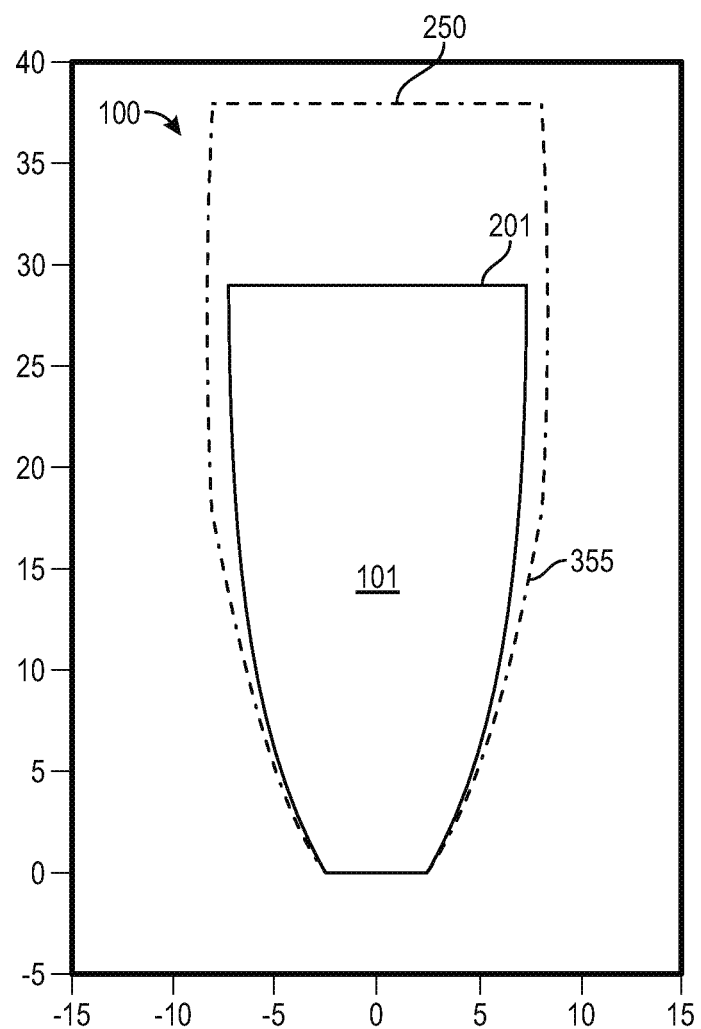
FIG. 13 illustrates a size difference between non-imaging optical concentrators according to an implementation.

FIG. 13 illustrates a size difference between non-imaging optical concentrators according to an implementation. As illustrated in FIG. 13, by incorporating a discontinuity 356 (defining the non-reflecting portion 355), the body 300 of the concentrator 100 can be extended outward and upward from a conventional DTIR concentrator 101 with the same design acceptance angle $\theta_A$. The extension is adjusted to balance the increase in the area of the top portion 200 and the non-reflecting portion 355 connecting the upper and lower segments of the sidewall 350. For example, in FIGS. 11-13, both concentrators have a half-acceptance angle $\theta_A$ of 27 degrees. However, the conventional concentrator 101 has a geometric concentration ratio of 8.2, whereas, the concentrator 100 incorporating a FFL microstructure 250 has 10.3 geometric concentration ratio.

Accordingly, the concentrator 100 including the FLL microstructure 250 may have a larger geometric concentration ratio than a conventional concentrator 101 with the same angle of acceptance but lacking the FLL microstructure 250. The concentrator 100 including the one or more non-reflecting portions 255 may have a larger geometric concentration ratio than a conventional concentrator 101 with the same angle of acceptance but lacking the non-reflecting portions 255.

EXAMPLES

As illustrated in FIGS. 14-16, the design process for a concentrator 100 according to implementations of the present disclosure can begin with consideration of the cross-section with respect to one of the principal axes perpendicular to the solar cell plane as contrasted with traditional DTIRC structures. The (half) acceptance angle, $\theta A$, can be predefined, along with the shape of the top surface curvature of this cross-section, which can, in theory, be any shape with axial symmetry, such as an arc of a circle, an ellipse, or a combination of straight lines. Due to the scalability of DTIRC structures, the width of the output plane (i.e. the solar cell width), d0, can be assigned any value. All other structural parameters are defined in relationship to d0 and thus can be scaled proportionally. FIG. 14A illustrates a diagram of a cross-sectional slice through the center axis of a generic DTIRC with a spherical top. The relevant lengths are labeled. In this case, before the numerical generation of the entire DTIRC profile, only the angle subtended by the top curve, $2\varphi$, needs to be predefined, and the radius or size of the circular top is mathematically determined as a result of the design generation process.

Following the principles of DTIRC profile generation, the light rays incident at OA are first refracted by the top surface at an angle determined by the refractive index of the lens material. When the deflected rays reach the side of the concentrator and undergo total internal reflection (TIR), the upper portion of the rays is directed to the opposite bottom corner of the structure while the lower portion is spread across the bottom surface. The lower portion of the sidewall can be defined in 2 different ways: using the phase conservation method (PCM) or the maximum concentration method (MCM). The former requires the corresponding rays to propagate in parallel after hitting the lower segment of the sidewall, while the latter requires that each ray hit the lower sidewall at exactly the TIR critical angle. Generally, the MCM usually yields slightly better (1-2%) geometric concentration ratio.

Accordingly, using the PCM for conventional DTIRCs allows simplification of the generation process for the concentrator 100 by defining one piece of additional critical information: the width of the entrance surface, d1, by applying the rule of etendue conservation nominally, so that: $d12 \sin \theta A = n \, d02 \sin \theta 0$, where $\theta 0$ is the tilt angle of parallel rays exiting the bottom surface. Etendue conservation, the fundamental principle that governs illumination optics under certain circumstances, can be seen here as the origin of the trade-off between the geometric concentration ratio (d12/d02) and the acceptance angle, $\theta A$.

Figure 14A:
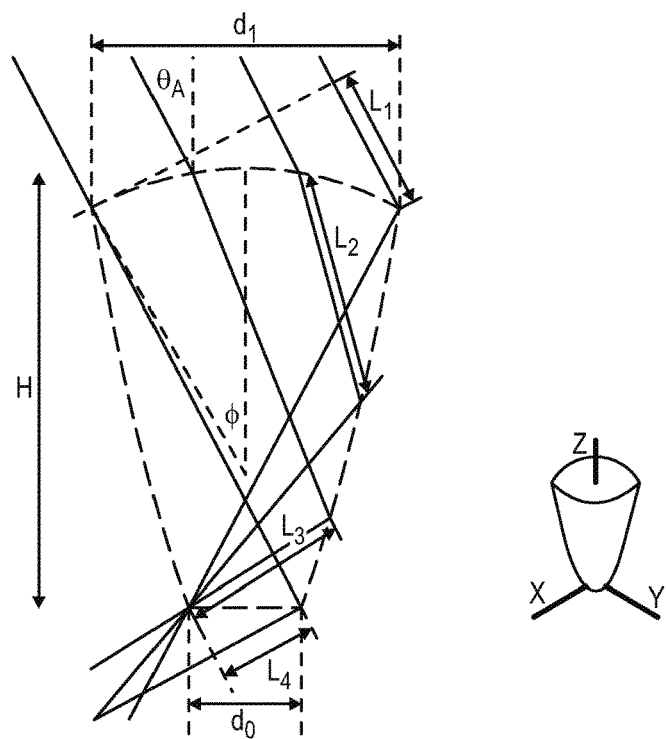
FIGS. 14A-D illustrate examples of non-imaging optical concentrator design and data on their characteristics according to implementations.
Figure 14B:
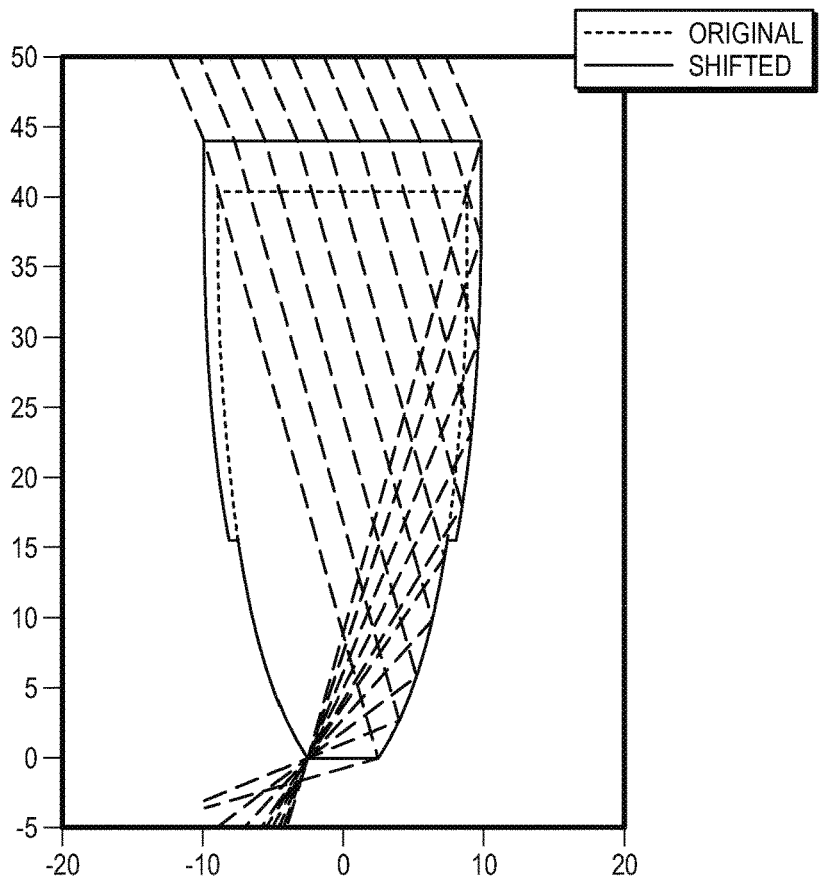

As illustrated in FIG. 14A, the path length of a given ray is divided into 4 segments. When phase conservation is assumed, a ray either hits the bottom corner of the DTIRC or reaches a linear wavefront that intersects the bottom corner. This condition can be satisfied if all rays have an identical sum of optical path lengths (OPLs) of the 4 segments, as described by Fermat's principle. If this is true, a smooth top surface can only result in gradual changes in all 4 segments of the OPLs during the calculation, and naturally leads to a continuous and smooth sidewall profile. However, rays propagating between two wavefronts do not need to have equal path lengths. A common example is rays that are focused by different rings of a Fresnel lens. As illustrated in FIG. 14B, we show a DTIRC with a flat top surface that has an OPL difference assigned for parts of the rays that travel farther than the rest, creating a shifted and discontinuous sidewall. In FIG. 14B, a design generated from the same input parameters but with a constant OPL is overlaid for comparison. The modified structure still satisfies the requirement for rays incident at $\theta A$ to be completely contained within the bottom segment and other predictions from the PCM, as illustrated by the ray diagram, but, here, the upper part of the structure expands over the original design creating a larger entrance surface size and correspondingly larger geometric concentration ratio. However, this design does not necessarily result in better overall performance. The discontinuous offset in the sidewall profile produces a gap that can redirect rays away from the bottom plane and contribute to reflection loss. Rays can hit the gap, either after they enter the structure, or after they are first reflected by the upper sidewall (i.e. the more likely case for rays with small AOIs). The situation is worse for rays with incident angles much smaller than $\theta A$, in which case a larger percentage of the rays is subject to hitting the gap. This is not a concern for the original DTIRC design, as ideally all rays with incident angles smaller than $\theta A$ are guaranteed to be directed to the bottom plane.

The gap in this example arises solely from the arbitrary optical path length differences that are assigned to rays entering through an initially smooth (flat) entrance surface. Straightforwardly, in contrast, an entrance surface that has a sharp turning point will create a corresponding turning point in the sidewall profile, so that the profile will have a discontinuous slope, and hence become non-smooth across the turning point. If, at the same time, an OPL difference is intentionally introduced exactly at the turning point, then by carefully tuning the combination of the entrance surface profile and the OPL difference, the resulting sidewall gap can be designed to possess a less abrupt and more monotonic transition between the upper and lower part of the rays, lessening or eliminating the problem in the previous example.

Figure 14C:
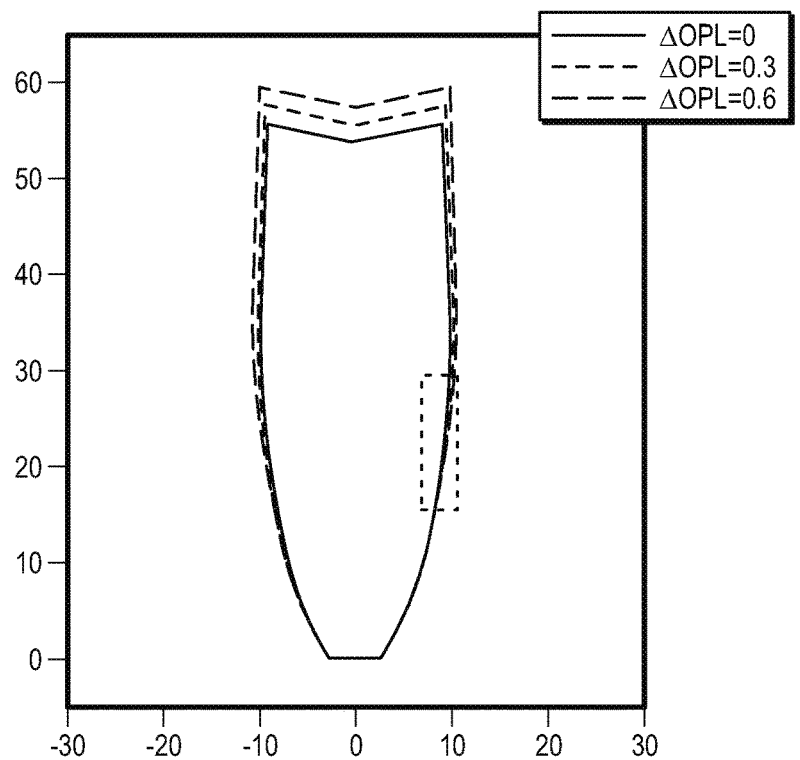
Figure 14D:
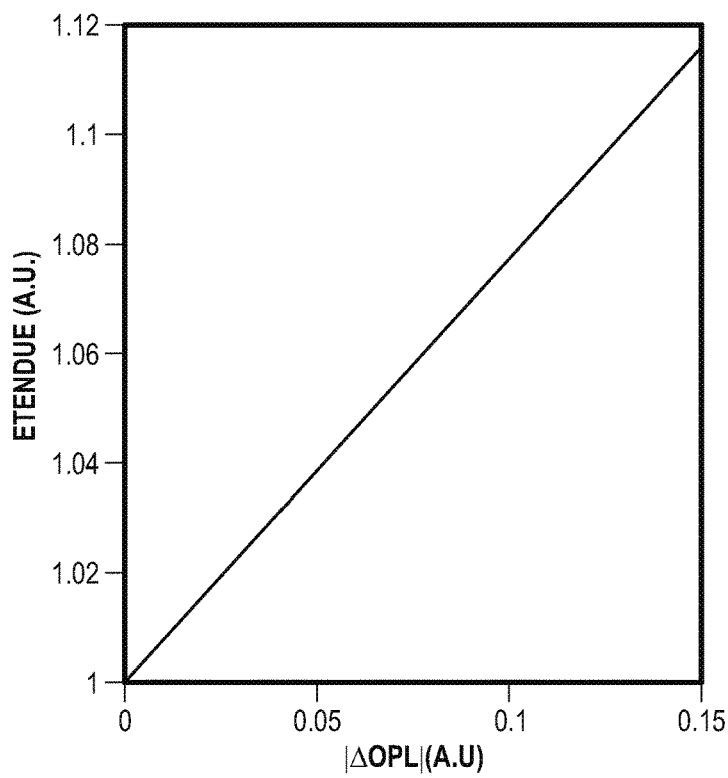

Accordingly, we found that for the top surface profile, a simple two-piece line segment (effectively a cone in 3D) is a good candidate. As shown in FIG. 14C, a series of DTIRC cross-section profiles with different OPL differences based on this type of entrance surface with a 120 symmetric inclination were generated. The intermediate segments here, or the gaps, are simply straight lines connecting the upper and lower parts of the sidewall. A non-negative $\Delta$OPL corresponds to a longer OPL for rays hitting the right portion of the entrance surface. Note that all sidewall profiles in FIG. 14C have relatively less drastic discontinuities compared with the example shown in FIG. 14B, and thus avoid excessive abnormal ray paths, while maintaining larger entrance surface sizes with greater $\Delta$OPLs. An important property is that, in all of these examples, the ratio of the projected entrance and exit widths, d1/d0, exceeds the limit defined by the nominal etendue conservation, as all profiles share the same set of parameters except d1. FIG. 14D shows the relationship between $\Delta$OPL and the normalized nominal etendue, which should be unity as indicated by the conservation law. However, even following this design process, the $\Delta$OPL cannot be set arbitrarily large before severely compromising the optical efficiency. It can be understood intuitively that, not only the slopes of the sidewalls, but also the behavior of the curvature over the intermediate segment, determine if rays are reflected at undesirable angles and ultimately not collected at the bottom plane. In FIG. 14C, it can be seen that as $\Delta$OPL increases, the slope of the intermediate segment becomes closer to that of the lower segment and diverges more from that of the upper segment. If this segment was interpolated, it would undergo a flatter transition downward, while the curvature near the connection point with the upper portion would eventually become too large for rays hitting this part to still be reflected to the bottom plane, again causing efficiency loss. This effect is demonstrated in FIG. 15A with the intermediate segment interpolated as described in the caption.

Figure 15A:
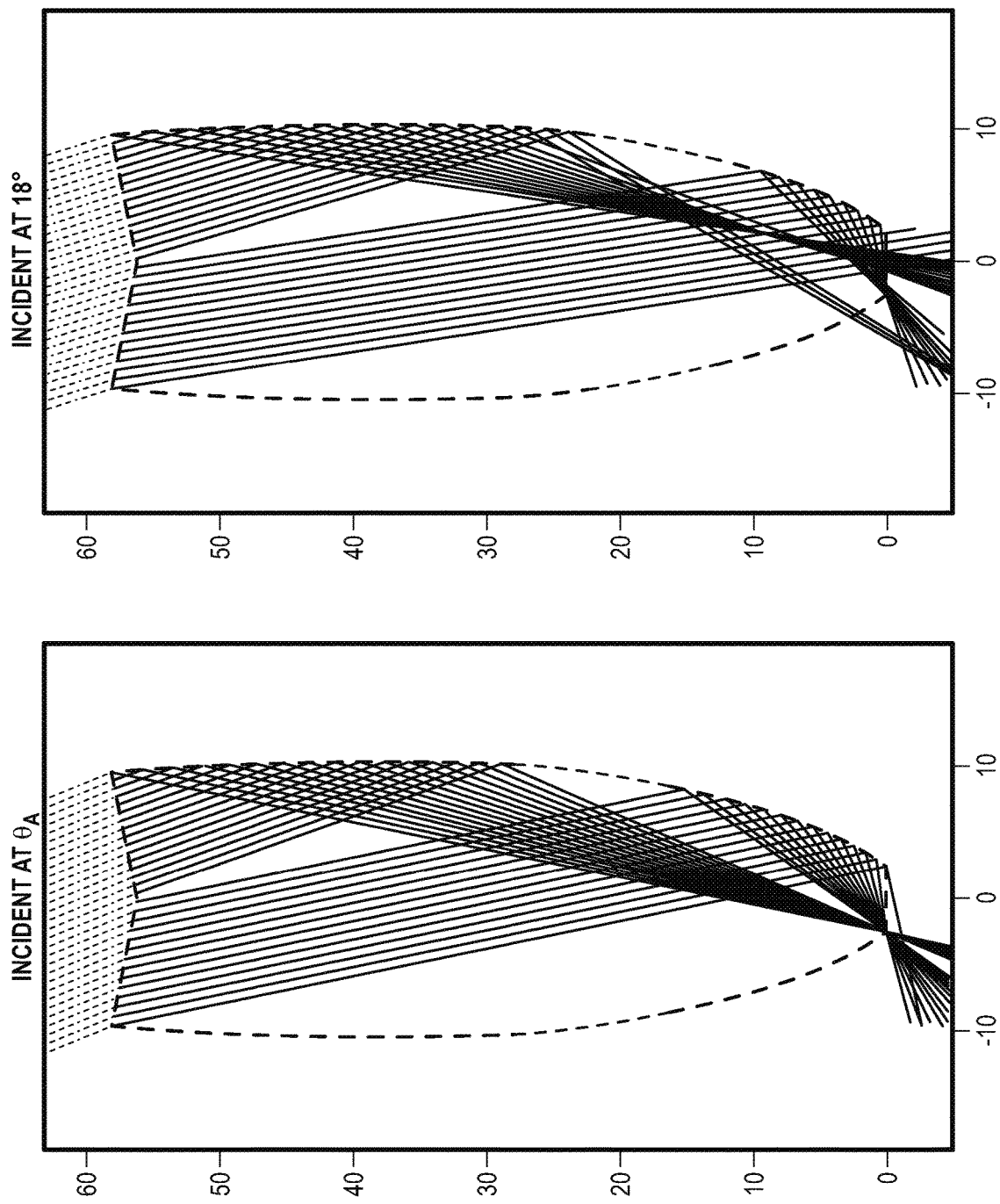
FIGS. 15A-C illustrate examples of non-imaging optical concentrator design and data on their characteristics according to implementations.

In the left panel of FIG. 15A, the rays incident at exactly $\theta$A can avoid hitting the sidewall gap and are therefore received by the bottom plane. However, in right panel of FIG. 15A, some of the rays at AOIs less than $\theta$A hit the interpolated portion of the sidewall and exit through the opposite sidewall. This implies that the magnitude of the $\Delta$OPL and the way that the intermediate segment is interpolated are critical in limiting the efficiency at angles smaller than $\theta$A.

Figure 15B:
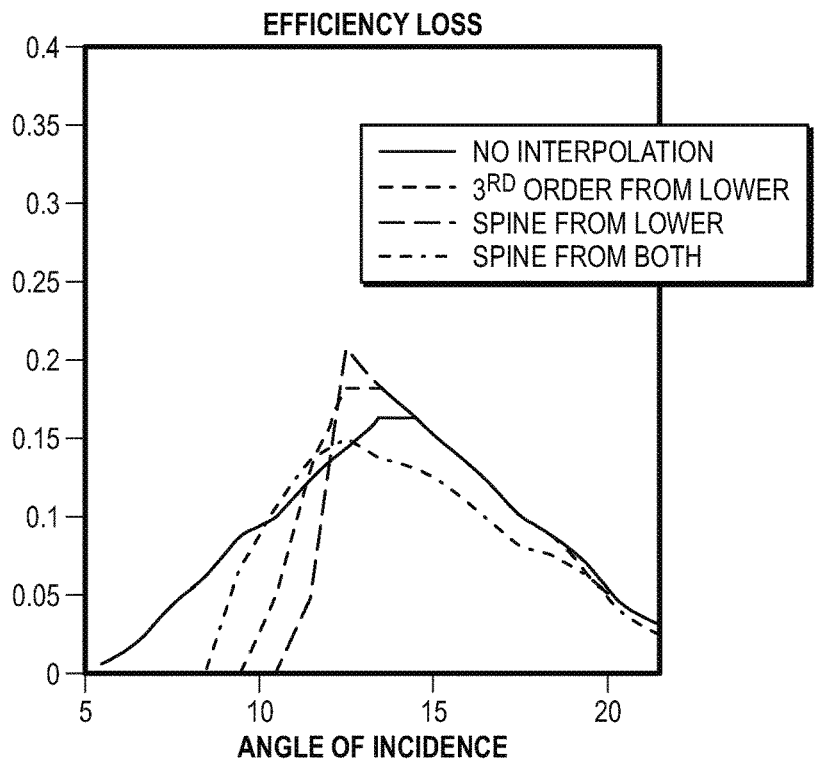
Figure 17:
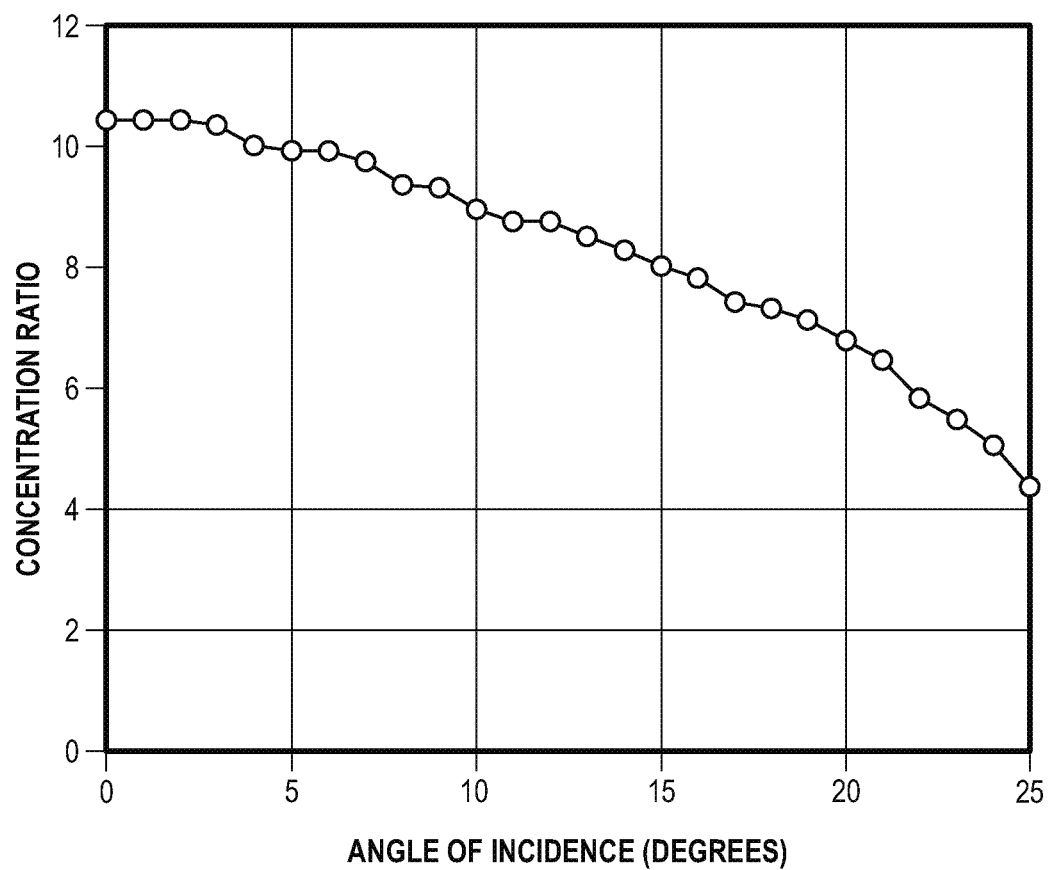
FIG. 17 illustrates a plot of concentration ratio vs. angle of incidence according to an implementation.

In FIG. 15B, the approximate 2D cross-sectional optical efficiency losses of DTIRCs with the same $\Delta$OPLs but intermediate segments interpolated using different methods are plotted against the AOIs. These efficiencies are obtained by taking the ratio of the number of rays exiting through the sidewalls to the total number of incident rays. The behaviors of the DTIRCs resulting from different sidewall interpolation methods are compared. We found that the efficiencies for vertical incidence rays and rays incident at $\theta$A are maintained at near unity for all interpolation methods. The exact interpolation method primarily affects efficiencies in the middle AOI range between these two extremes. Compared with straight-line connections, interpolation reduces the loss of rays after hitting the gap due to a sudden change in the sidewall slope, and interpolation towards the endpoints of both the upper and lower profiles further reduces losses for incidence angles of around 15-20°, yet at the cost of an earlier drop in the efficiency curve. FIG. 17 illustrates a plot of concentration ratio vs. angle of incidence for a concentrator 100 according to an implementation.

Figure 15C:
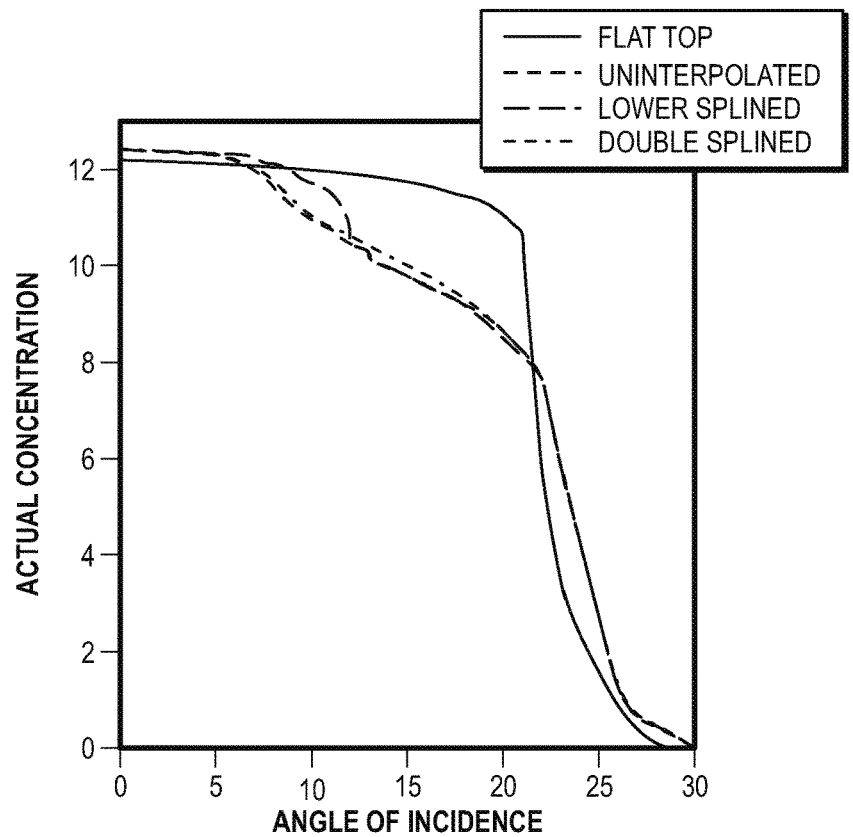

The full 3D structure for the concentrator 100 design can be generated to accurately evaluate and understand its performance. We can apply the generation procedure described above for the 2D cross-section design at each azimuthal angle (angle along the z-axis in the FIG. 14A inset), given the projected d0 at each angle from a predefined bottom solar cell contour, and impose the condition that the shape of the top entrance surface must be preserved and continuous for all azimuthal angles. The examples shown in FIGS. 15A-C will therefore have conical top surfaces in their corresponding full 3D structures. This method ensures that the entire DTIRC structure bears the symmetry of the bottom solar cell plane. Here, we consider a recipient solar cell with a square shape: d0 is equal on the two major axes x and y. For all generated 3D profiles, we then test the single-axis angular-dependent actual concentration ratio, defined as the total power received at the solar cell plane at a certain angle divided by that received without any concentrator at normal AOL. As a comparison, the method used to generate the 2D efficiency plot in FIG. 15B can be considered as a quick test of the effects of the interpolated segment before completing the full 3D simulation, which is necessary to obtain the true efficiency of the 3D structure as well as the real concentration ratio. In FIG. 15C, efficiency results for a concentrator with a conical top with a 120 inclination angle and a $\theta$A of 22.5° on both major axes with different interpolation methods are presented. We chose a refractive index, n, of 1.42 for the lens material, corresponding to the value for polydimethylsiloxane (PDMS), to demonstrate the potential of the concentrator 100 designs when made from a flexible, affordable and environment-friendly, yet relatively low-index, polymeric material. For a baseline comparison, we include the results for a conventional DTIRC with a flat entrance surface and $\theta$A=21° because its nominal geometric concentration ratio of 12.5 is close 12.7, the concentration ratio of our improved designs.

All of the designs explored so far have efficiencies close to unity at low AOIs. The conventional design maintains this efficiency at AOIs close to $\theta$A, while the efficiency curves of the concentrator 100 according to implementations of the present disclosure can start to decline at smaller AOIs due to the aforementioned issues with the intermediate segment continuity, but have wider angular acceptance ranges as predicted by a 1.5° larger design $\theta$A. The efficiency differences at intermediate AOIs between the different interpolation methods are qualitatively consistent with the 2D cross-sectional efficiency test shown in FIG. 15B. Simplistically, the conventional design may outperform other designs if the integrated area under the efficiency curve is taken as the overall ability of the DTRIC to receive and concentrate solar power from a moving source traversing a hemispherical dome. This is true when only single-axis acceptance is considered. However, if we consider the movement of the sun across the celestial sphere over the course of a year, light arriving at larger AOIs should contribute considerably more to the total received solar power at the concentrator input, thus favoring structures with wider acceptance capabilities, such as the concentrator 100 of the present disclosure.

Figure 16A:
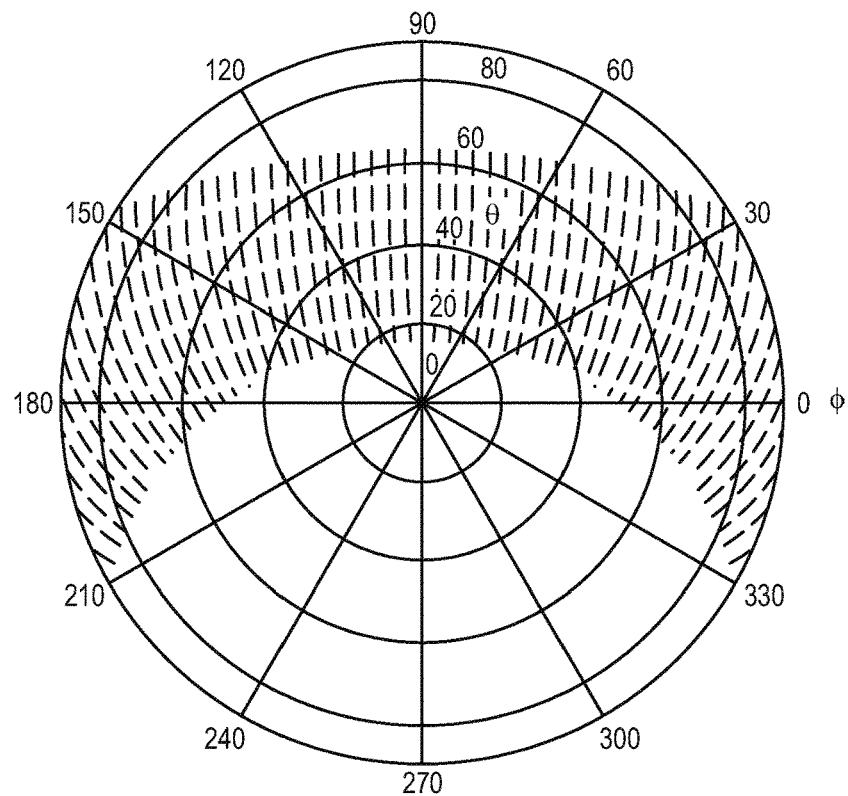
FIGS. 16A-C illustrate data on characteristics of a non-imaging optical concentrator according to implementations.
Figure 16B:
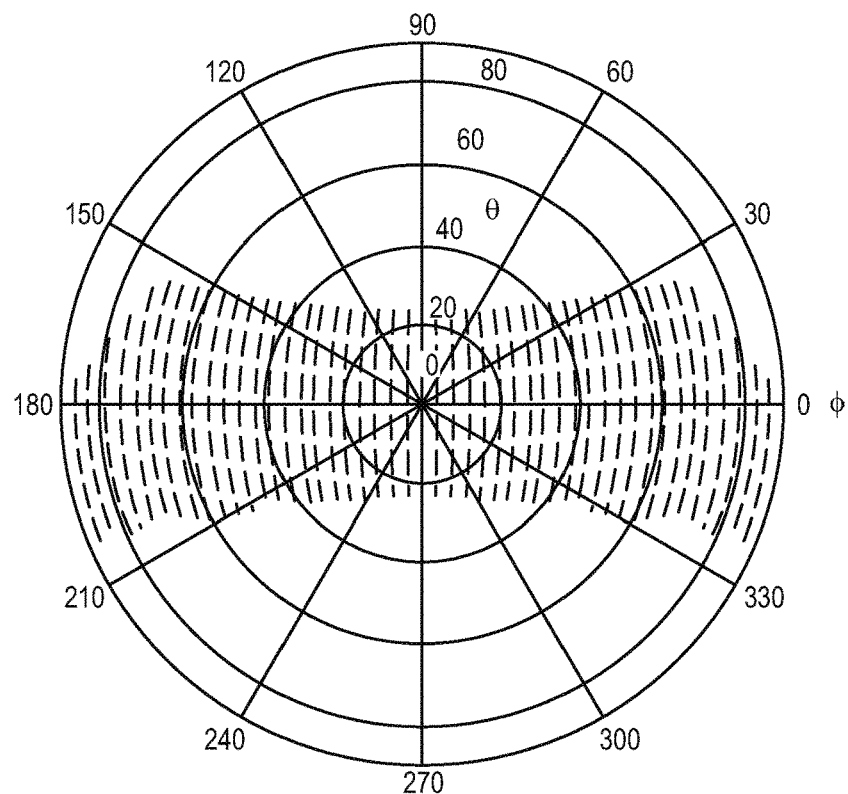
Figure 16C:
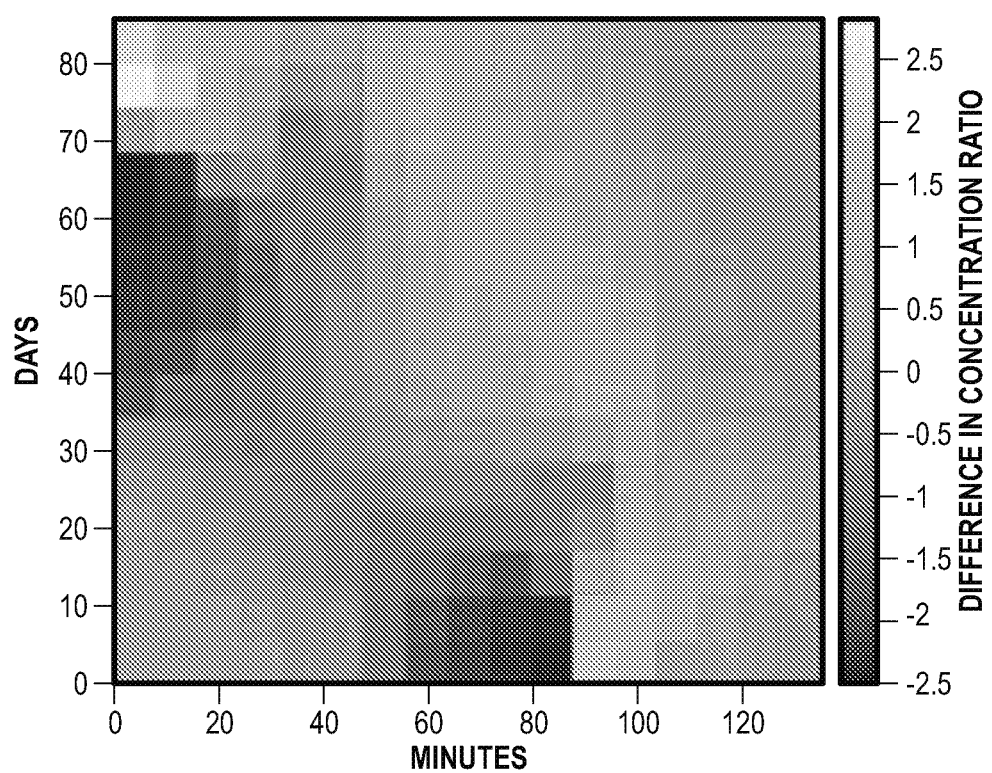

To calculate the annual practical solar power that could be collected by different DTIRC designs, the sun's position at all times of the year must be taken into account. Given the latitude of the location of interest on the surface of the earth, the time of day and time of year, the obliquity of 23.5°, and ignoring anomalous motion of the earth's revolution and rotation, the sun's course in terms of the polar angle θ and azimuthal angle φ with respect to the local terrestrial normal vector can be analytically solved. The results are shown in FIG. 16A for a latitude of 39.3°, corresponding roughly to Baltimore, Maryland. The sun's trajectory is sampled with a constant interval of 12 hours throughout the year. For a static concentrator mounted parallel to the ground, the figure shows the range of angles that it will receive direct solar power from. It can be straightforwardly determined that the orientation that maximizes light collection for a static concentrator is the angle corresponding to the sun's location at noon on the equinox, i.e., directed towards the centroid of the sun's annual course. In this case, the full angular acceptance range of the concentrator can be better utilized. The results for this mounting orientation are shown in FIG. 16B. Note that for terrestrial locations not on the equator, the sun's trajectory may not be exactly symmetric about this orientation due to the relative lengthening and shortening of daytime in the summer and winter, respectively, in the northern hemisphere. However, this may have no effect on the concentrator efficiency because the imbalance only occurs for small elevation angles corresponding to θ~90°, well outside of the acceptance range of any practical concentrator. We calculated the annual collectible solar power by considering the average annual concentration ratio for different DTIRC designs, assuming that the concentrators are oriented at the optimum mounting angle. For this step, instead of obtaining 2D concentration maps in the local angular space (θ, φ), we found it more convenient to sample the maps over constant time intervals. Because of the varying angular velocity of the sun in (θ, φ) space, sampling at constant temporal intervals allows us to calculate the total average annual concentration ratio via direct summation of the sampled data, as long as the sampling grid has sufficient resolution. The angular position of the solar source at a specific time can then be derived by successive rotations about the x-axis by the declination angle δ=arcsin(sin 23.5° sin 2π da) and about the y-axis by the hour angle HRA=15° t, where a stands for the total number of days in a year, d for the number of days past the equinox, and t for the number of hours past noon. The angle of solar radiation along the x-axis never exceeds 23.5°, and that is the reason we have chosen 21° and 22.5°, respectively, for θA in the conventional and concentrator 100 designs, in order to fully utilize the diminishing but still finite angular acceptance beyond the designed θA. We also found that a 16×16 grid for a quarter of the four-fold-symmetric 2D concentration map (equivalent to a 31×31 grid for the full range) yields sufficiently accurate results. In FIG. 16C, a full-year time-dependent concentration factor difference map between the improved DTIRC design and the conventional DTIRC design is shown. The results agree with the 1D line scan in that the new design outperforms the conventional design at the edges and center of the angular acceptance range. The total annual average power is hence calculated to be 1.035 suns for the conventional design and 1.056 suns for concentrator 100 according to the present disclosure. The designs according to the present disclosure provide approximately 2% more overall power for the recipient solar cell over the course of a year despite its disadvantages at intermediate AOIs. In comparison, a standard static flat panel mounted at the optimum orientation angle receives only 0.305 suns on average annually, indicating that utilizing a concentrator 100 can enable at least a 3.5-fold increase in power per unit area over the course of a year.

We also carried out optical simulations to calculate the efficiency of different DTIRC designs in collecting diffuse solar power. The simulations are set up with a diffusive hemispherical light source that is much larger than the dimensions of the concentrators imitating an isotropic celestial background, with the entrance surface of the DTIRC placed near the origin of the hemisphere. We found that the conventional DTIRC receives 1.91 times the power while the concentrator 100 design of the present disclosure receives 1.93 times the power that can be otherwise collected by a receiving area identical to the bottom plane of the DTIRCs (i.e. a static solar cell). Typically, the diffuse background light component on a clear day can make up about 10% of the total solar radiation received by a horizontal surface. This percentage is also implied by the difference between the total power in the AM1.5 global horizontal irradiance and the AM1.5 direct normal irradiance spectra. This amount of diffuse solar power could be significantly higher under inclement weather conditions.

Accordingly, the improved concentrator 100 designs of the present disclosure offer advantages over a comparable conventional design for both direct and diffusive solar radiation collection which should translate into practical gains in output power in applications.

The present disclosure provides a non-imaging optical concentrator with improved angle of acceptance and geometric concentration ratio. The improved angle of acceptance and geometric concentration ratio thus decrease or eliminate the need for sunlight tracking or tilting systems. For example, as described above, due to their higher concentration of nearly vertical rays, as well as an extended acceptance angle range, the new non-imaging optical concentrator of the present disclosure are capable of delivering more annual collectible solar power than the comparable conventional designs, in the absence of any tracking system.

The present disclosure has been described with reference to exemplary implementations. Although a few implementations have been shown and described, it will be appreciated by those skilled in the art that changes can be made in these implementations without departing from the principles and spirit of preceding detailed description. It is intended that the present disclosure be construed as including all such modifications and alterations insofar as they come within the scope of the appended claims or the equivalents thereof.

What is claimed, is:

1. A non-imaging optical concentrator, comprising:
    a top portion,
    a body, and
    a bottom portion,
    wherein the top portion is configured to receive an incident light and transmit the received incident light to the body when the incident light is within an angle of acceptance for the non-imaging optical concentrator, and
    where the body is configured to reflect the incident light transmitted by the top portion to the bottom portion when the incident light is within the angle of acceptance for the non-imaging optical concentrator, and
    wherein the top portion is configured to split the incident light into two or more directions, and wherein the body comprises one or more non-reflecting portions that do not reflect the incident light transmitted by the top portion to the bottom portion when the incident light is within the angle of acceptance for the non-imaging optical concentrator.

2. The non-imaging optical concentrator of claim 1, wherein the non-imaging optical concentrator has a half-acceptance angle from about 5° to about 50° and a geometric concentration ratio from about 5 to about 30.

3. The non-imaging optical concentrator of claim 1, wherein the non-imaging optical concentrator has a half-acceptance angle from about 10° to about 40° and a geometric concentration ratio from about 5 to about 30.

4. The non-imaging optical concentrator of claim 1, wherein the non-imaging optical concentrator has a half-acceptance angle from about 20° to about 30° and a geometric concentration ratio from about 9 to about 13.

5. The non-imaging optical concentrator of claim 1, wherein the top portion comprises a Fresnel-lens like (FLL) microstructure.

6. The non-imaging optical concentrator of claim 5, wherein the FLL microstructure is configured to split incident light received by the top portion into two or more directions.

7. The non-imaging optical concentrator of claim 5, wherein the FLL microstructure does not focus light to a single point.

8. The non-imaging optical concentrator of claim 5, wherein the FLL microstructure is integrally formed to the body.

9. The non-imaging optical concentrator of claim 5, wherein the FLL microstructure is separately formed and attached to the body.

10. The non-imaging optical concentrator of claim 1, wherein the body comprises one or more sidewalls configured to reflect the incident light transmitted by the top portion including the one or more non-reflecting portions when the incident light is within the acceptance angle for the concentrator, and
wherein the body further comprises at least one optical path discontinuity to define the one or more non-reflecting portions in the body.

11. The non-imaging optical concentrator of claim 10, wherein each of the one or more sidewalls comprises two or more reflecting portions and the one or more non-reflecting portions.

12. The non-imaging optical concentrator of claim 11, wherein one of the one or more non-reflecting portions is disposed between the two or more reflecting portions.

13. The non-imaging optical concentrator of claim 11, wherein the two or more reflecting portions correspond to the two or more directions of the incident light transmitted by the top portion when the incident light is within the angle of acceptance for the non-imaging optical concentrator.

14. The non-imaging optical concentrator of claim 11, wherein the one or more non-reflecting portions do not reflect the incident light transmitted by the top portion when the incident light is within the angle of acceptance for the non-imaging optical concentrator.

15. The non-imaging optical concentrator of claim 1, wherein the top portion and the body each comprise a suitable optically clear or transparent material.

16. The non-imaging optical concentrator of claim 5, wherein FLL microstructure comprises one or more of polydimethylsiloxane (PDMS), epoxy, spin-on glass (SOG), and acrylic materials.

17. The non-imaging optical concentrator of claim 1, wherein the top portion and the body each have a refractive index of about 1 or more.

18. The non-imaging optical concentrator of claim 6, wherein the non-imaging optical concentrator comprising the FLL microstructure has a larger geometric concentration ratio than a non-imaging optical concentrator with the same angle of acceptance but lacking the FLL microstructure.

19. The non-imaging optical concentrator of claim 11, wherein the non-imaging optical concentrator comprising the one or more non-reflecting portions has a larger geometric concentration ratio than a non-imaging optical concentrator with the same angle of acceptance but lacking the one or more non-reflecting portions.

20. A solar cell, comprising:
a substrate;
a solar cell disposed over the substrate; and
a non-imaging optical concentrator optically aligned with the solar cell,
wherein the non-imaging optical concentrator is configured to concentrate an incident light received by the non-imaging optical concentrator on the surface of the solar cell, and
wherein the non-imaging optical concentrator comprises:
a top portion,
a body, and
a bottom portion,
wherein the top portion is configured to receive an incident light and transmit the received incident light to the body when the incident light is within an angle of acceptance for the non-imaging optical concentrator, and
where the body is configured to reflect the incident light transmitted by the top portion to the bottom portion when the incident light is within the angle of acceptance for the non-imaging optical concentrator, and
wherein the top portion is configured to split the incident light into two or more directions, and wherein the body comprises one or more non-reflecting portions that do not reflect the incident light transmitted by the top portion to the bottom portion when the incident light is within the angle of acceptance for the non-imaging optical concentrator.

* * * * *